US011121140B2

(12) United States Patent
Yang et al.

(10) Patent No.: US 11,121,140 B2
(45) Date of Patent: Sep. 14, 2021

(54) FERROELECTRIC TUNNEL JUNCTION MEMORY DEVICE WITH INTEGRATED OVONIC THRESHOLD SWITCHES

(71) Applicant: SANDISK TECHNOLOGIES LLC, Addison, TX (US)

(72) Inventors: Seung-Yeul Yang, Pleasanton, CA (US); Raghuveer S. Makala, Campbell, CA (US); Fei Zhou, San Jose, CA (US); Adarsh Rajashekhar, Santa Clara, CA (US); Rahul Sharangpani, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/737,088

(22) Filed: Jan. 8, 2020

(65) Prior Publication Data

US 2021/0210497 A1 Jul. 8, 2021

(51) Int. Cl.
*H01L 47/00* (2006.01)
*H01L 27/11514* (2017.01)
*H01L 49/02* (2006.01)
*H01L 27/11504* (2017.01)
*H01L 45/00* (2006.01)
*H01L 23/528* (2006.01)

(52) U.S. Cl.
CPC ...... *H01L 27/11514* (2013.01); *H01L 23/528* (2013.01); *H01L 27/11504* (2013.01); *H01L 28/40* (2013.01); *H01L 45/1233* (2013.01); *H01L 45/141* (2013.01)

(58) Field of Classification Search
CPC . H01L 27/11514; H01L 28/40; H01L 45/141; H01L 23/528; H01L 45/1233; H01L 27/11504; H01L 47/00
See application file for complete search history.

(56) References Cited

U.S. PATENT DOCUMENTS

| | | | |
|---|---|---|---|
| 5,915,167 A | 6/1999 | Leedy | |
| 9,607,713 B1* | 3/2017 | Em | ........... G11C 5/147 |
| 9,741,764 B1* | 8/2017 | Terai | ........... H01L 27/11582 |
| 9,941,299 B1 | 4/2018 | Chen et al. | |
| 10,115,897 B1 | 10/2018 | Sato | |
| 10,121,965 B1 | 11/2018 | Uno et al. | |
| 10,199,434 B1 | 2/2019 | Lee et al. | |
| 10,224,372 B2 | 3/2019 | Mori | |

(Continued)

FOREIGN PATENT DOCUMENTS

WO WO2017105514 A1 6/2017

OTHER PUBLICATIONS

Chanthbouala, A. et al., "Solid-state memories based on ferroelectric tunnel junctions," Nature Nanotechnology, vol. 7, pp. 101-104, Feb. 2012, www.nature.com/naturenanotechnology, (2012).

(Continued)

*Primary Examiner* — Caleb E Henry
(74) *Attorney, Agent, or Firm* — The Marbury Law Group PLLC

(57) ABSTRACT

A ferroelectric tunnel junction memory device includes a bit line, a word line and a memory cell located between the bit line and the word line. The memory cell includes a ferroelectric tunneling dielectric portion and an ovonic threshold switch material portion.

20 Claims, 27 Drawing Sheets

(56) References Cited

U.S. PATENT DOCUMENTS

| | | | |
|---|---|---|---|
| 10,249,683 | B1 | 4/2019 | Lille et al. |
| 10,256,272 | B2 | 4/2019 | Yoshida et al. |
| 10,283,710 | B2 | 5/2019 | Kikuchi et al. |
| 10,354,728 | B2 | 7/2019 | Rajamohanan et al. |
| 10,381,409 | B1 | 8/2019 | Zhou et al. |
| 10,381,411 | B2 | 8/2019 | Lille |
| 10,381,559 | B1 | 8/2019 | Zhou et al. |
| 10,541,011 | B1* | 1/2020 | Hong .................. G11C 13/0026 |
| 10,622,049 | B1* | 4/2020 | Hong ...................... G11C 7/12 |
| 2004/0145850 | A1* | 7/2004 | Fukumoto ............. H01F 41/302 361/143 |
| 2014/0071732 | A1* | 3/2014 | Khalili Amiri ..... G11C 11/1675 365/145 |
| 2015/0249096 | A1* | 9/2015 | Lupino .................... G11C 5/02 257/203 |
| 2016/0359109 | A1 | 12/2016 | Kamimuta et al. |
| 2016/0365133 | A1 | 12/2016 | Ino et al. |
| 2017/0069841 | A1 | 3/2017 | Ino et al. |
| 2017/0177515 | A1* | 6/2017 | Yoon .................. G11C 13/0069 |
| 2017/0237000 | A1* | 8/2017 | Terai ................... H01L 45/1233 257/4 |
| 2017/0243922 | A1* | 8/2017 | Eun ....................... H01L 23/528 |
| 2017/0250222 | A1* | 8/2017 | Wu ......................... H01L 45/04 |
| 2017/0288138 | A1* | 10/2017 | Lee ....................... H01L 45/144 |
| 2017/0338279 | A1* | 11/2017 | Yang ................... H01L 45/1253 |
| 2018/0166453 | A1* | 6/2018 | Muller .................... H01L 28/40 |
| 2018/0342557 | A1 | 11/2018 | Mori |
| 2018/0358556 | A1 | 12/2018 | Kang et al. |
| 2018/0374899 | A1 | 12/2018 | Yoshida et al. |
| 2019/0074441 | A1 | 3/2019 | Kikuchi et al. |
| 2019/0088664 | A1 | 3/2019 | Kabuyanagi et al. |
| 2019/0148390 | A1* | 5/2019 | Frank ................ H01L 21/02282 257/295 |
| 2019/0189688 | A1 | 6/2019 | Lille |
| 2019/0287599 | A1 | 9/2019 | Higashi et al. |
| 2019/0288192 | A1 | 9/2019 | Takahashi et al. |
| 2019/0354843 | A1 | 11/2019 | Park et al. |
| 2019/0363087 | A1* | 11/2019 | Zhou .................... H01L 27/1085 |
| 2020/0006432 | A1 | 1/2020 | Grobis et al. |
| 2020/0035493 | A1* | 1/2020 | Clark .................... C23C 16/517 |

OTHER PUBLICATIONS

Benjamin, S. L. et al., "Controlling the nanostructure of bismuth telluride by selective chemical vapour deposition from a single source precursor," J. Mater. Chem. A, 2014, vol. 2, pp. 4865-4869, (2014).

Goh, Y. et al., "Enhanced tunneling electroresistance effects in HfZrO-based ferroelectric tunnel junctions by high-pressure nitrogen annealing," Appl. Phys. Lett., vol. 113, pp. 052905-1-052905-5 (2018); doi: 10.1063/1.5040031, (2018).

Garcia, V. et al., "Ferroelectric tunnel junctions for information storage and processing," Nature Communications, Nature Communications | 5:4289 | DOI: 10.1038/ncomms5289, www.nature.com/naturecommunications, (2014).

Garcia, V. et al., "Giant tunnel electroresistance for non-destructive readout of ferroelectric states," Nature, vol. 460, Jul. 2, 2009, pp. 81-84, doi:10.1038/nature08128, (2009).

Xi, Z. et al., "Giant tunnelling electroresistance in metal/ferroelectric/ semiconductor tunnel junctions by engineering the Schottky barrier," Nature Communications, vol. 8:15217, pp. 1-9, DOI: 10.1038/ncomms15217, (2016).

De Groot, C. H. et al., "Highly Selective Chemical Vapor Deposition of Tin Diselenide Thin Films onto Patterned Substrates via Single Source Diselenoether Precursors," Chem. Mater. 2012, vol. 24, pp. 4442-4449, (2012).

Wen, Z. et al., "Ferroelectric-field-effect-enhanced electroresistance in metal / ferroelectric / semiconductor tunnel junctions," Nature Materials, vol. 12, pp. 617-621 (2013).

Li, J. et al., "Ultrafast polarization switching in thin-film ferroelectrics," Appl. Phys. Lett. vol. 84, pp. 1174-1176 (2004); https://doi.org/10.1063/1.1644917.

U.S. Appl. No. 16/138,001, filed Sep. 21, 2018, SanDisk Technologies LLC.

U.S. Appl. No. 16/227,889, filed Dec. 20, 2018, SanDisk Technologies LLC.

U.S. Appl. No. 16/249,300, filed Jan. 16, 2019, SanDisk Technologies LLC.

U.S. Appl. No. 16/291,673, filed Mar. 4, 2019, SanDisk Technologies LLC.

U.S. Appl. No. 16/374,330, filed Apr. 3, 2019, SanDisk Technologies LLC.

U.S. Appl. No. 16/412,764, filed May 15, 2019, SanDisk Technologies LLC.

U.S. Appl. No. 16/440,250, filed Jun. 13, 2019, SanDisk Technologies LLC.

U.S. Appl. No. 16/440,378, filed Jun. 13, 2019, SanDisk Technologies LLC.

U.S. Appl. No. 16/454,458, filed Jun. 27, 2019, SanDisk Technologies LLC.

U.S. Appl. No. 16/454,475, filed Jun. 27, 2019, SanDisk Technologies LLC.

U.S. Appl. No. 16/456,736, filed Jun. 28, 2019, SanDisk Technologies LLC.

U.S. Appl. No. 16/457,687, filed Jun. 28, 2019, SanDisk Technologies LLC.

U.S. Appl. No. 16/457,721, filed Jun. 28, 2019, SanDisk Technologies LLC.

U.S. Appl. No. 16/530,256, filed Aug. 2, 2019, SanDisk Technologies LLC.

U.S. Appl. No. 16/541,289, filed Aug. 15, 2019, SanDisk Technologies LLC.

U.S. Appl. No. 16/568,668, filed Sep. 12, 2019, SanDisk Technologies LLC.

U.S. Appl. No. 16/577,176, filed Sep. 20, 2019, SanDisk Technologies LLC.

U.S. Appl. No. 16/694,340, filed Nov. 25, 2019, SanDisk Technologies LLC.

Notification of Transmittal of the International Search Report and Written Opinion of the International Search Authority for International Patent Application No. PCT/US2020/036049, dated Feb. 26, 2021, 11 pages.

* cited by examiner

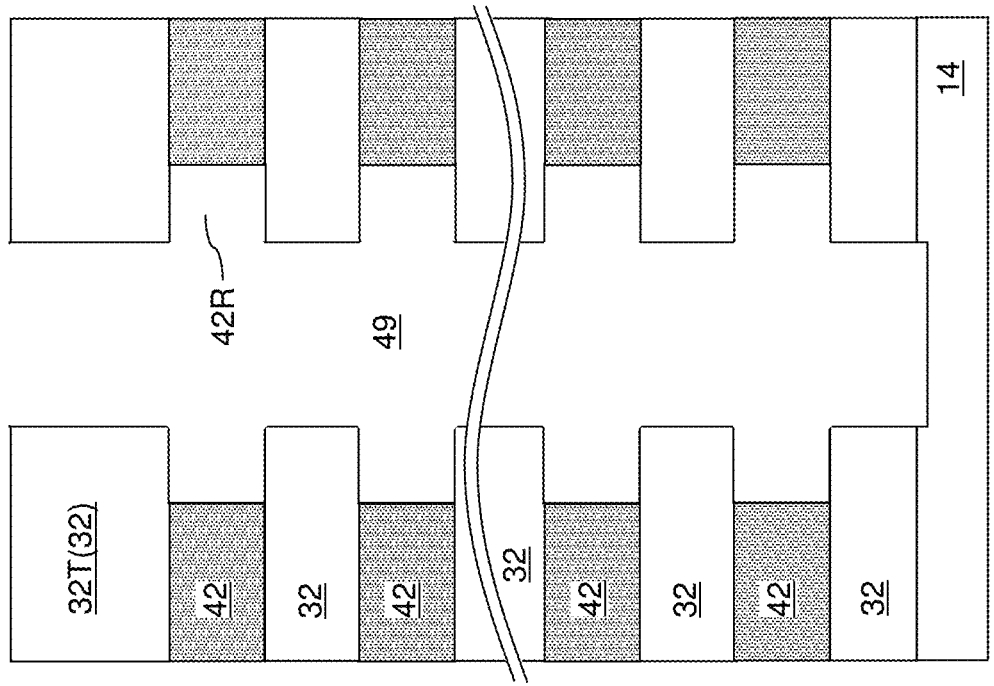
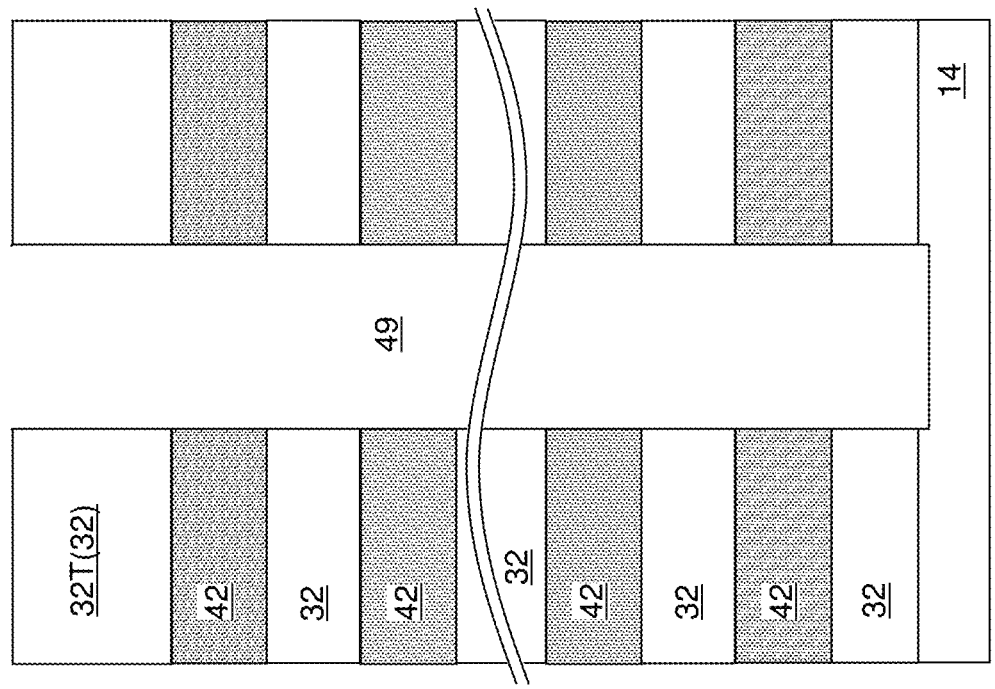

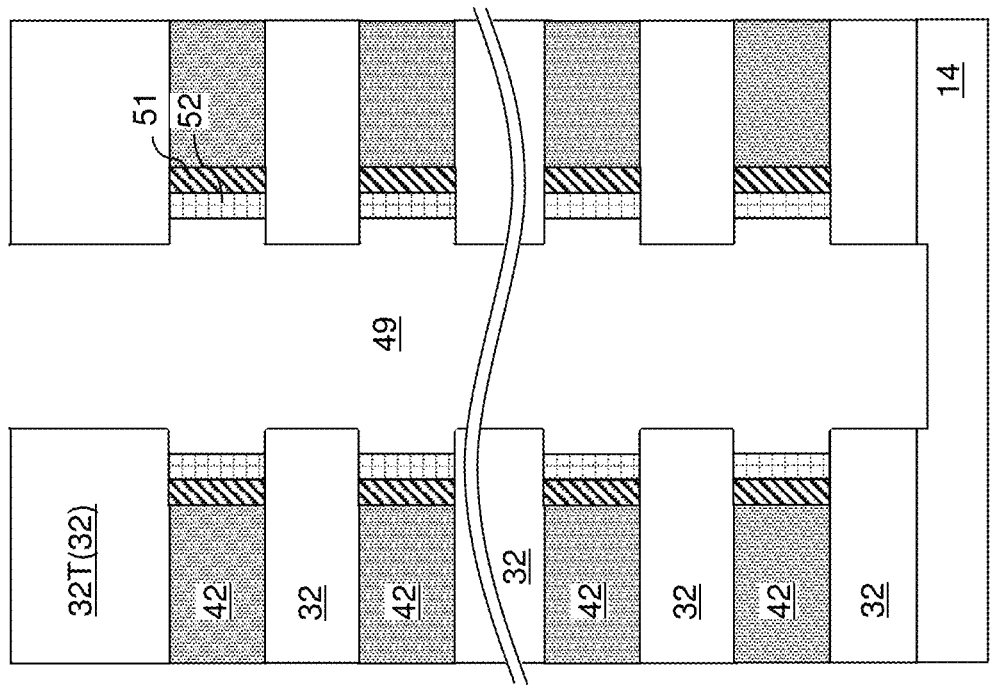
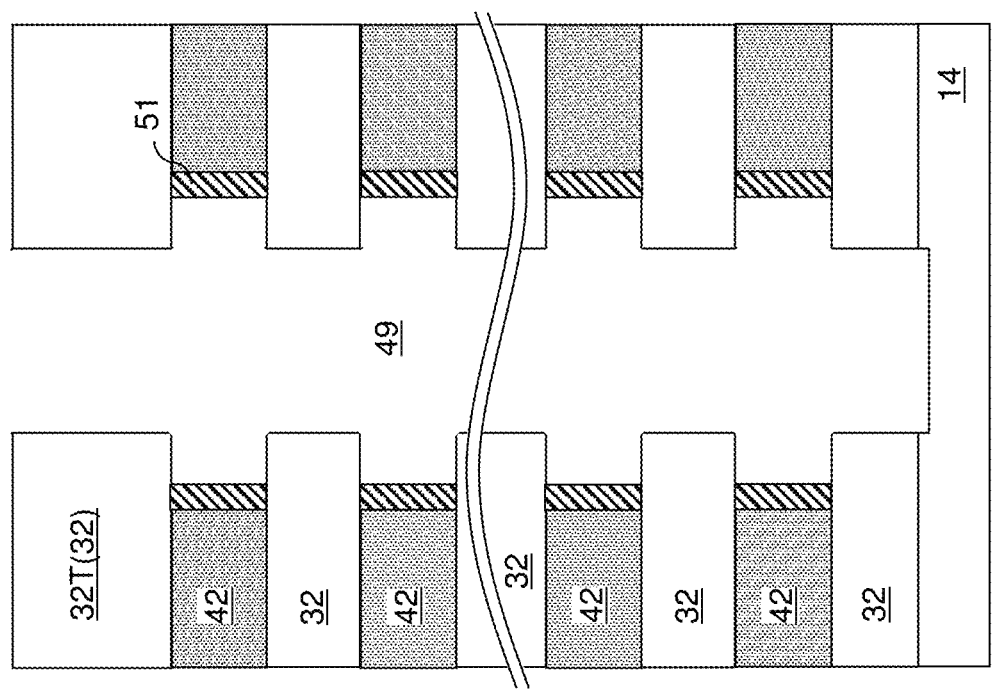

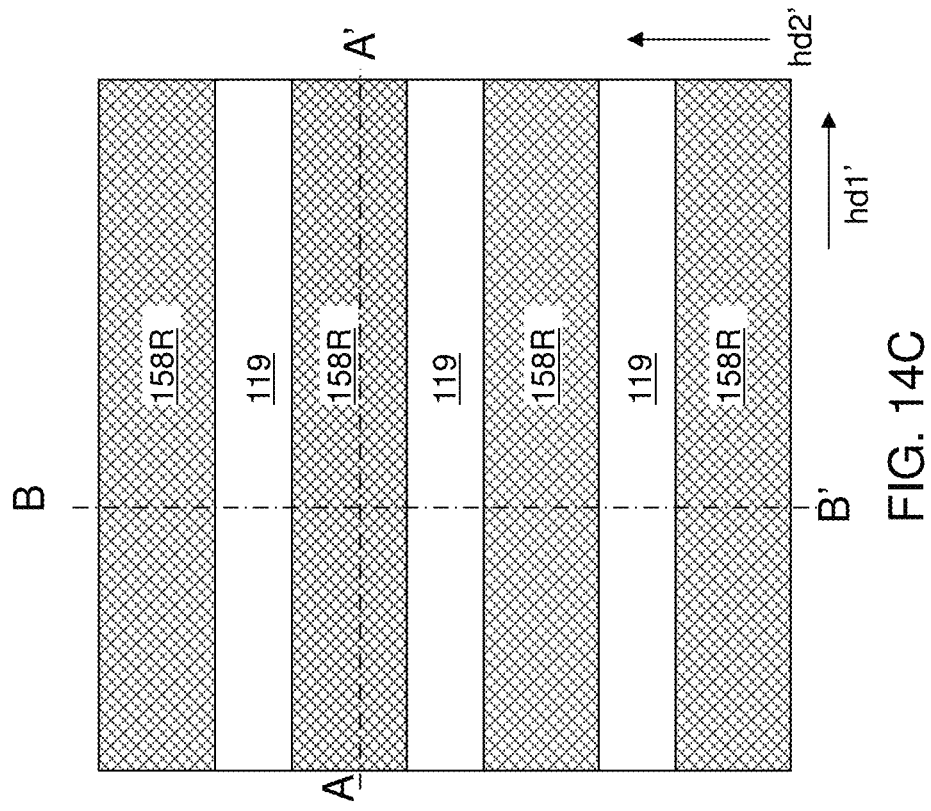
FIG. 14A
FIG. 14C
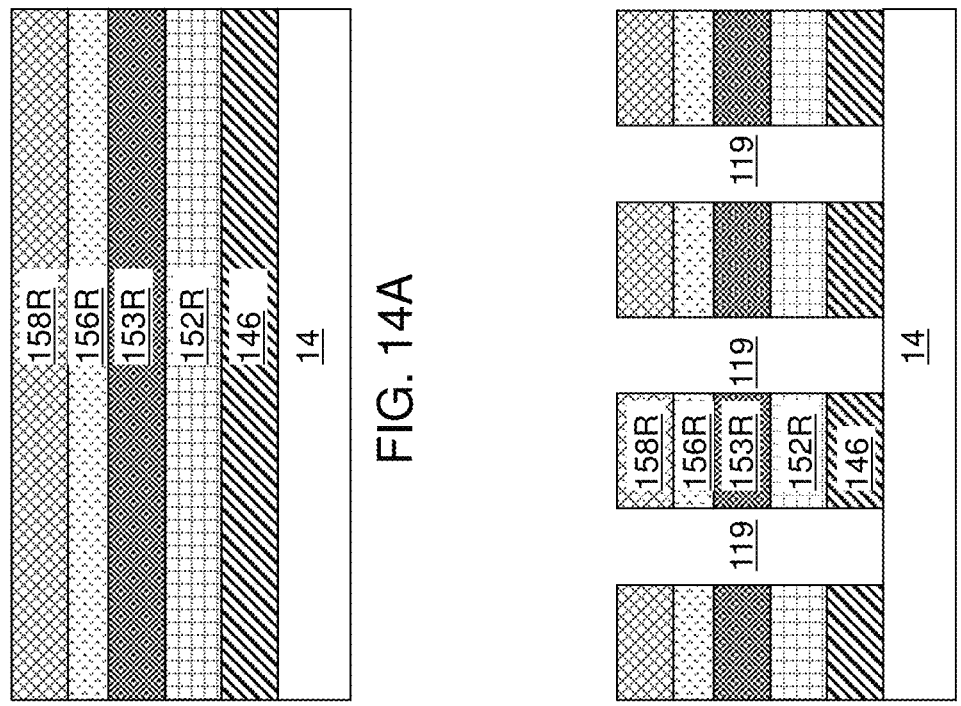
FIG. 14B

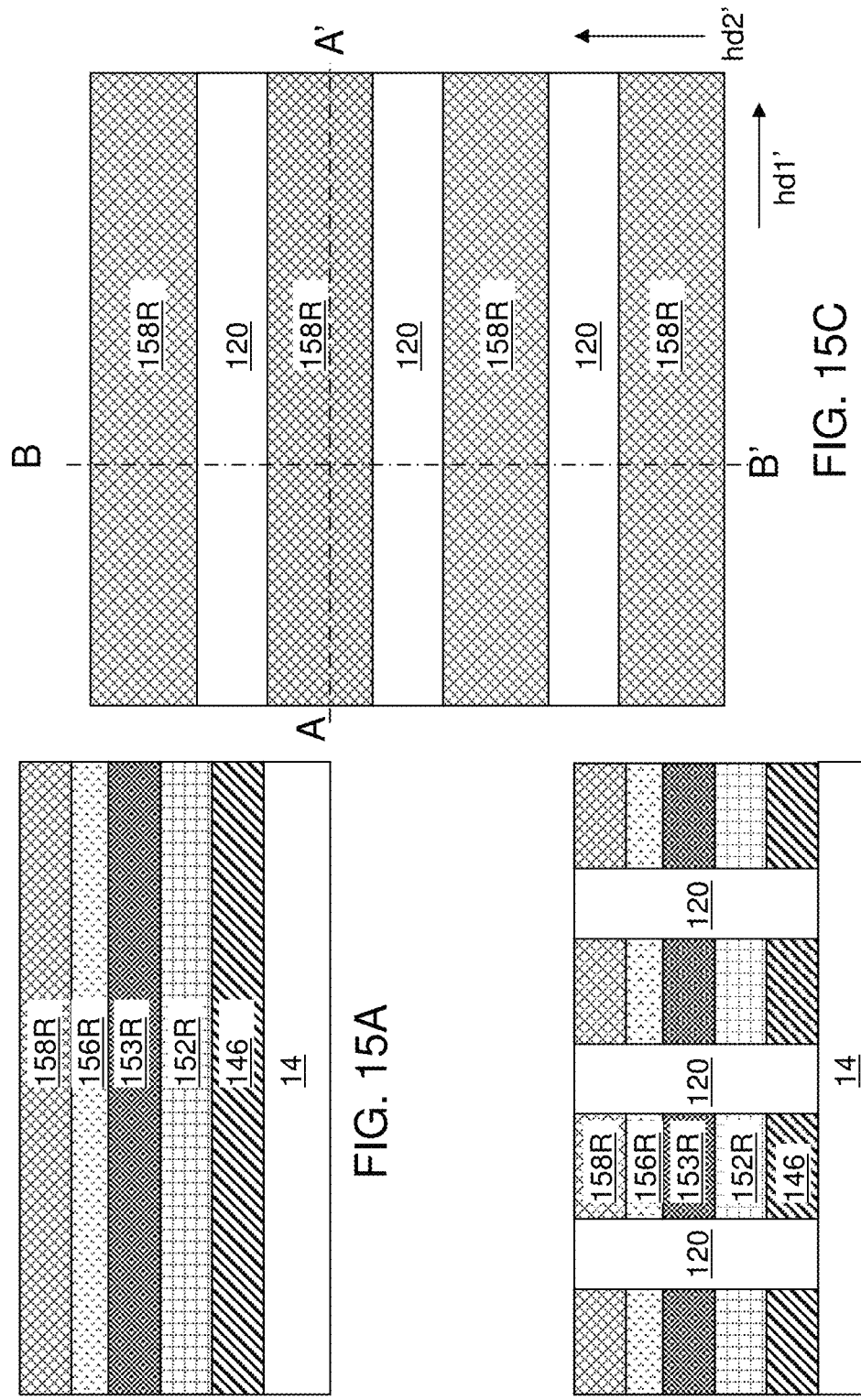

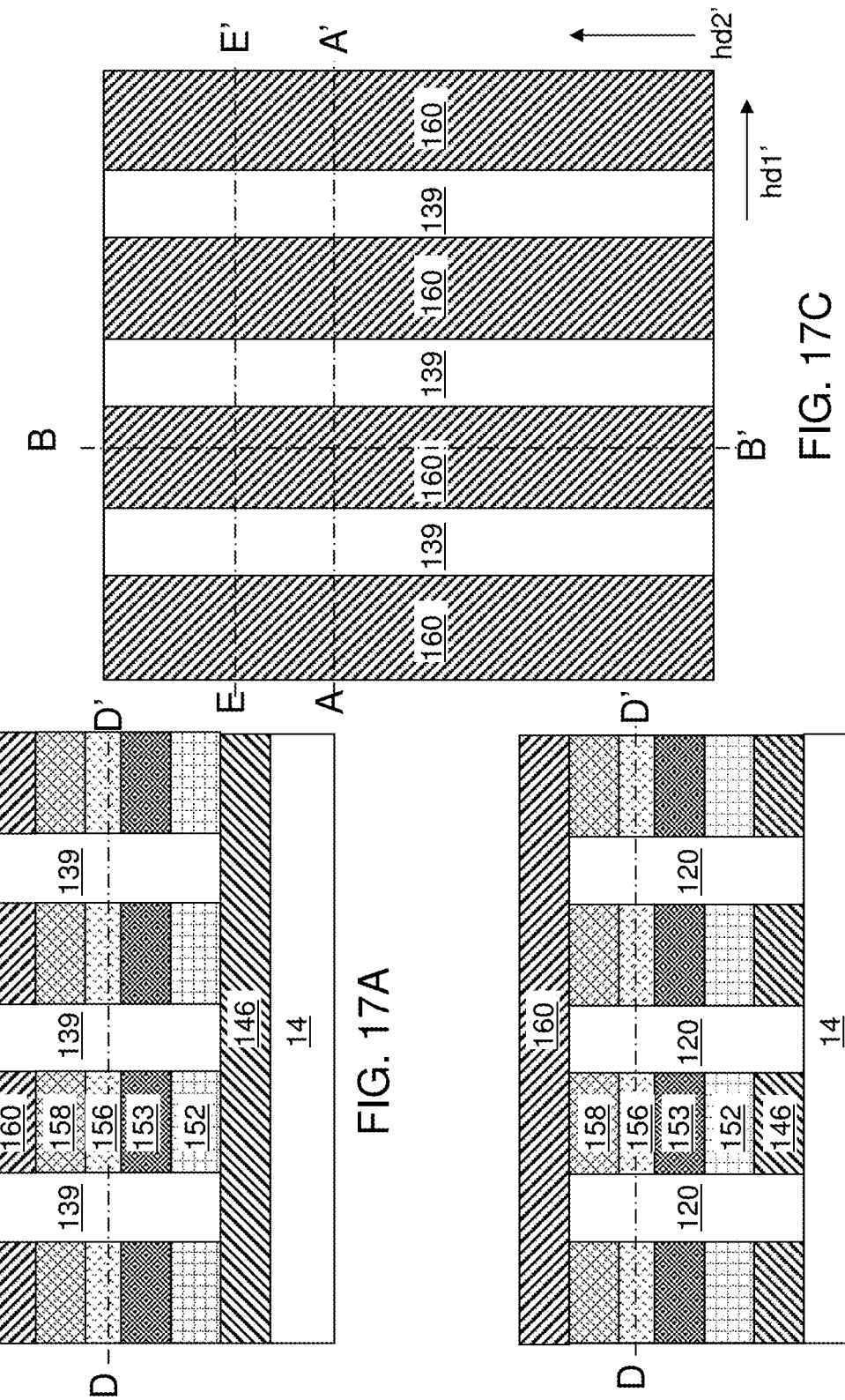

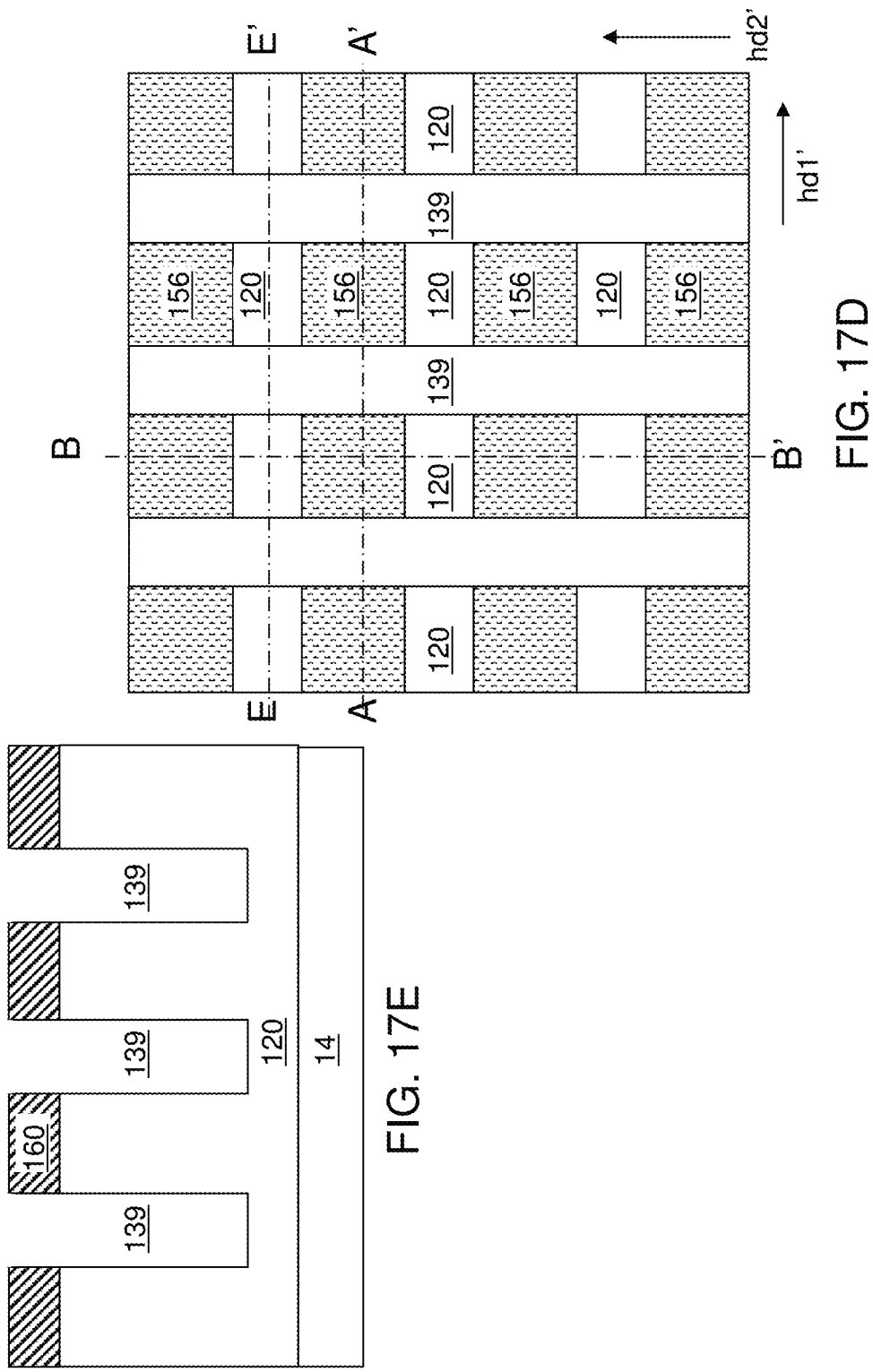

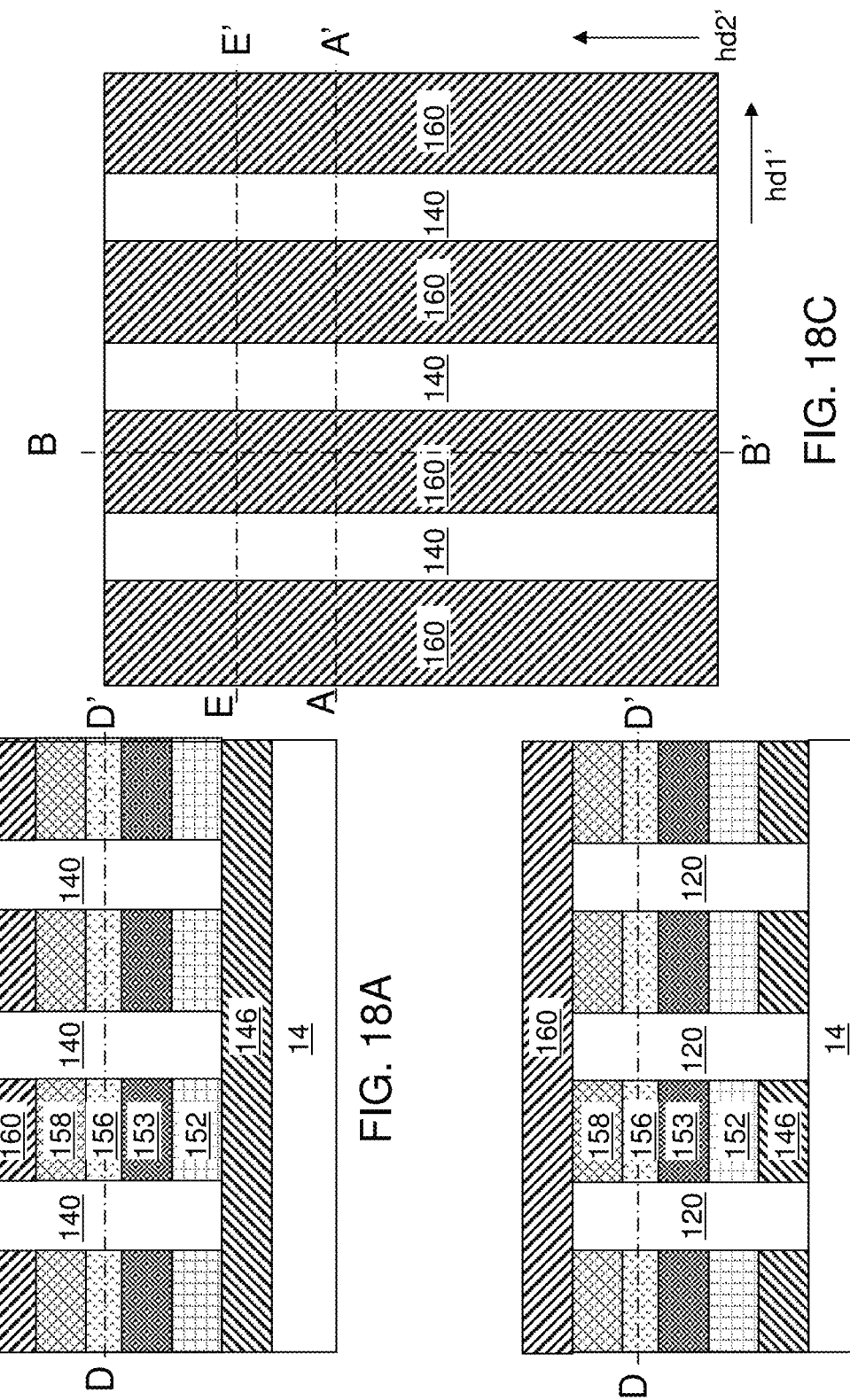

FERROELECTRIC TUNNEL JUNCTION MEMORY DEVICE WITH INTEGRATED OVONIC THRESHOLD SWITCHES

FIELD

The present disclosure relates generally to the field of solid state devices, and particularly to ferroelectric tunnel junction memory devices including integrated ovonic threshold switches and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remnant polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

SUMMARY

According to an aspect of the present disclosure, a ferroelectric tunnel junction memory device includes a bit line, a word line and a memory cell located between the bit line and the word line. The memory cell includes a ferroelectric tunneling dielectric portion and an ovonic threshold switch material portion.

According to another aspect of the present disclosure, a method of forming a three-dimensional ferroelectric memory array is provided, which comprises: forming an alternating stack of insulating layers and sacrificial material layers over a substrate; forming a two-dimensional array of memory openings through the alternating stack; forming lateral recesses by recessing the sacrificial material layers selective to the insulating layers around each of the memory openings; forming ovonic threshold switch material portions within the lateral recesses; forming a ferroelectric tunneling dielectric layer within each of the memory openings; and replacing the sacrificial material layers with electrically conductive layers.

According to still another aspect of the present disclosure, a method of forming a ferroelectric memory array is provided, which comprises: forming a one-dimensional array of first electrically conductive lines over a substrate, wherein the first electrically conductive lines laterally extend along a first horizontal direction and are laterally spaced apart from each other along a second horizontal direction; forming an array of pillar structures located over the one-dimensional array of first electrically conductive lines, wherein each of the pillar structures comprises an ovonic threshold switch material plate and a ferroelectric tunneling dielectric plate; and forming a one-dimensional array of second electrically conductive lines located over the rectangular array of pillar structures, wherein the second electrically conductive lines laterally extend along the second horizontal direction and are laterally spaced apart from each other along the first horizontal direction.

BRIEF DESCRIPTION OF THE DRAWINGS

FIGS. 5A-5G are sequential vertical cross-sectional views of a memory opening during formation of a memory opening fill structure according to the first embodiment of the present disclosure.

FIG. 14A is a first vertical cross-sectional view of the second exemplary structure after formation of first line trenches according to the second embodiment of the present disclosure.

FIG. 14B is a second vertical cross-sectional view of the second exemplary structure of FIG. 14A.

FIG. 14C is a top-down view of the second exemplary structure of FIGS. 14A and 14B. The vertical plane A-A' is the plane of the vertical cross-sectional view of FIG. 14A. The vertical plane B-B' is the plane of the vertical cross-sectional view of FIG. 14B.

FIG. 15A is a first vertical cross-sectional view of the second exemplary structure after formation of lower dielectric separator structures according to the second embodiment of the present disclosure.

FIG. 15B is a second vertical cross-sectional view of the second exemplary structure of FIG. 15A.

FIG. 15C is a top-down view of the second exemplary structure of FIGS. 15A and 15B. The vertical plane A-A' is the plane of the vertical cross-sectional view of FIG. 15A. The vertical plane B-B' is the plane of the vertical cross-sectional view of FIG. 15B.

FIG. 17A is a first vertical cross-sectional view of the second exemplary structure after formation of second line trenches according to the second embodiment of the present disclosure.

FIG. 17B is a second vertical cross-sectional view of the second exemplary structure of FIG. 17A.

FIG. 17C is a top-down view of the second exemplary structure of FIGS. 17A and 17B. The vertical plane A-A' is the plane of the vertical cross-sectional view of FIG. 17A. The vertical plane B-B' is the plane of the vertical cross-sectional view of FIG. 17B.

FIG. 17D is a horizontal cross-sectional view of the second exemplary structure along the horizontal plane D-D' of FIGS. 17A and 17B. The vertical plane A-A' is the plane of the vertical cross-sectional view of FIG. 17A. The vertical plane B-B' is the plane of the vertical cross-sectional view of FIG. 17B.

FIG. 17E is a third vertical cross-sectional view along the vertical plane E-E' of the second exemplary structure of FIGS. 17C and 17E.

FIG. 18A is a first vertical cross-sectional view of the second exemplary structure after formation of upper dielectric separator structures according to the second embodiment of the present disclosure.

FIG. 18B is a second vertical cross-sectional view of the second exemplary structure of FIG. 18A.

FIG. 18C is a top-down view of the second exemplary structure of FIGS. 18A and 18B. The vertical plane A-A' is the plane of the vertical cross-sectional view of FIG. 18A. The vertical plane B-B' is the plane of the vertical cross-sectional view of FIG. 18B.

DETAILED DESCRIPTION

Figure 1:
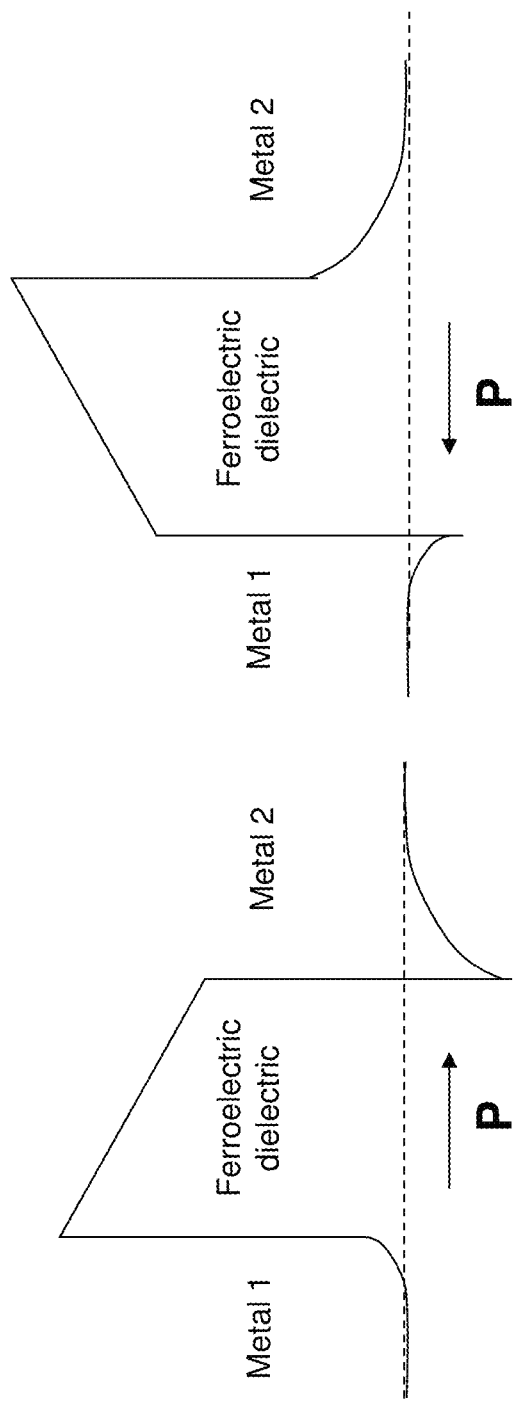
FIG. 1A is an electrostatic potential energy band profile of a ferroelectric tunnel junction including a first metal, a ferroelectric tunneling dielectric, and a second metal while the ferroelectric tunneling dielectric is in a first polarization state according to an embodiment of the present disclosure.
FIG. 1B is an electrostatic potential energy band profile of the ferroelectric tunnel junction of FIG. 1A while the ferroelectric tunneling dielectric is in a second polarization state according to an embodiment of the present disclosure.

As discussed above, the embodiments of the present disclosure are directed to ferroelectric tunnel junction memory devices including integrated ovonic threshold switches and methods of manufacturing the same, the various aspects of which are described below. The ferroelectric tunnel junction memory devices of the embodiments of the disclosure provide reliably controllable, high density memory device with fast read/write speed, low operating energy, scalability, and simplicity of manufacturing.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Referring to FIGS. 1A and 1B, electrostatic potential energy band profiles are illustrated for a ferroelectric tunnel junction device including a first metal, a tunneling ferroelectric dielectric, and a second metal for two different polarization directions of the tunneling ferroelectric dielectric. The first metal and the second metal can be different, and the magnitude and the lateral extent of the distortion in the conduction band due to the dipole moment P in the ferroelectric tunneling dielectric can be asymmetric. The asymmetric band modulations induced in the ferroelectric tunnel junction can change the tunneling electrical resistance of the ferroelectric tunnel junction depending on the direction of the electric dipole moment in the ferroelectric tunneling dielectric. Generally, polarization reversal of a ferroelectric tunnel junction can modulate a tunnel transmission coefficient induced by two different average barrier heights. Thus, electrostatic potential energy band profiles for the two different polarization states of the ferroelectric tunneling dielectric provide two different electrical resistance states, which can be employed to program and store a data bit. The ratio of the conductance in the low electrical resistance state to the conductance in the high resistance state can be in a range from 10 to 1,000, such as from 30 to 300, although lesser and greater ratios may also be employed. The polarization state of the ferroelectric tunneling dielectric exhibits a hysteresis curve as a function of an external voltage bias across the first metal and the second metal, and is capable of storing a data bit. The programmable resistance states of a ferroelectric tunnel junction is used in various ferroelectric memory devices of the embodiments of the present disclosure.

Figure 2:
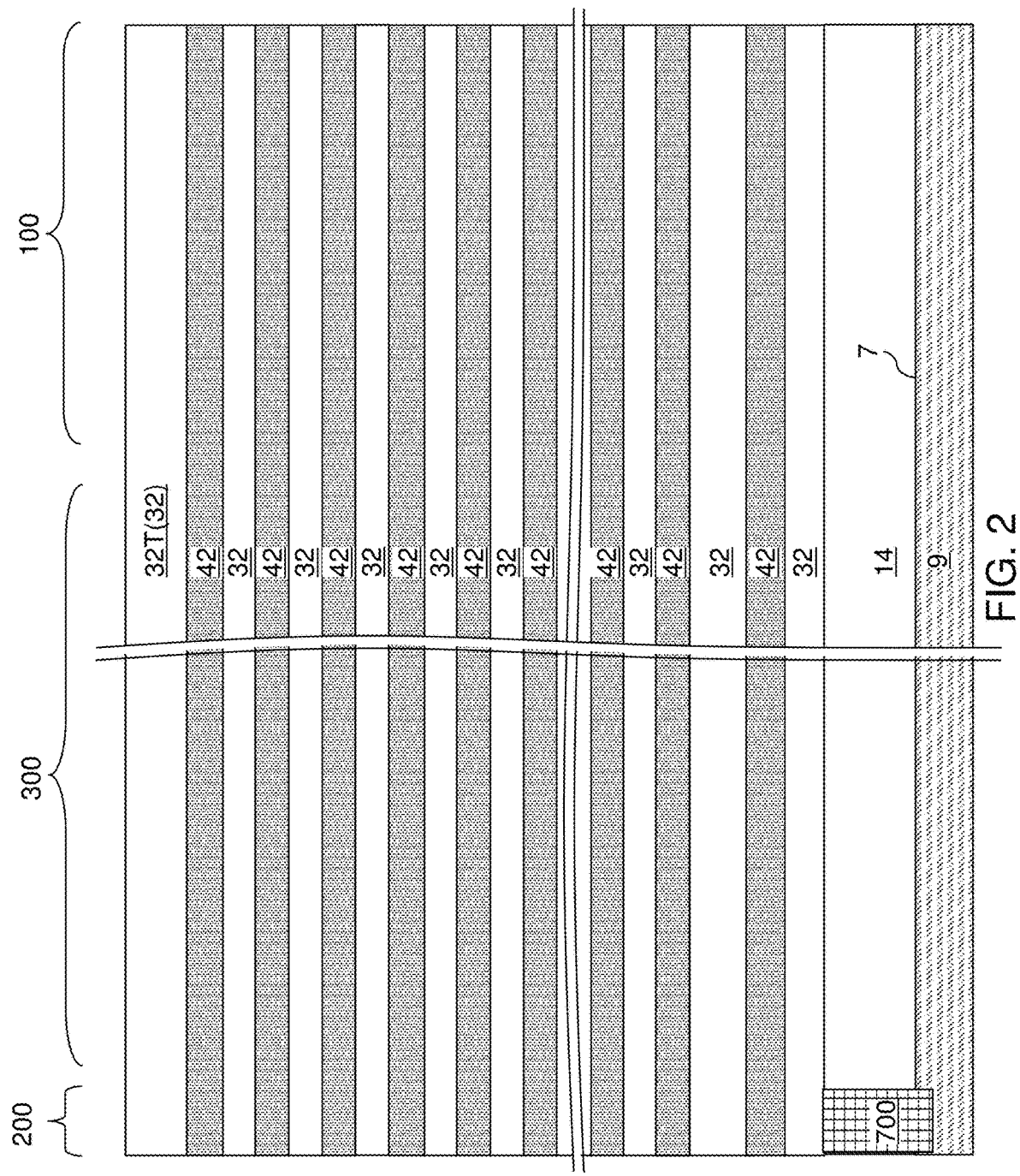
FIG. 2 is a schematic vertical cross-sectional view of the first exemplary structure after formation of an alternating stack of insulating layers and sacrificial material layers according to the first embodiment of the present disclosure.

Referring to FIG. 2, a first exemplary structure according to a first embodiment of the present disclosure is illustrated, which can be employed, for example, to fabricate a three-dimensional vertical bit line (VBL) type device structure with two terminal memory cells. The first exemplary structure includes a substrate 9. The substrate 9 may be a semiconductor wafer (e.g., single crystal silicon wafer), an insulating substrate (e.g., glass, ceramic or polymer substrate), or a conductive substrate (e.g., metal substrate). The substrate 9 can have a major surface 7, which can be, for example, a topmost surface of the substrate 9. The major surface 7 can be a semiconductor surface. In one embodiment, the major surface 7 can be a single crystalline semiconductor surface, such as a single crystalline semiconductor surface.

At least one semiconductor device 700 for a peripheral circuitry can be formed on a portion of the substrate 9. The at least one semiconductor device can include, for example, field effect transistors. The at least one semiconductor device 700 can comprise a driver circuit for controlling operation of memory devices to be subsequently formed.

A dielectric material such as silicon oxide may be optionally deposited over the at least one semiconductor device, and can be subsequently planarized to form a planar isolation dielectric layer 14. Generally, the optional planar isolation dielectric layer 14, if present, can be formed on the top surface of the substrate 9 prior to, or after, formation of the at least one semiconductor device 700 by deposition of a dielectric material such as silicon oxide.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

A stack of an alternating plurality of first material layers (which can be insulating layers 32) and second material layers (which can be sacrificial material layers 42) is formed over the top surface of the planar isolation dielectric layer 14. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as word lines of the memory device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as word lines of the memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42. A topmost insulating layer 32T, which is a topmost one of the insulating layers 32, can have a greater thickness than insulating layers 32 located between an overlying sacrificial material layer 42 and an underlying sacrificial material layer 32.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers (e.g., word lines). In this case, steps for replacing the spacer material layers with electrically conductive layers can be omitted.

Figure 3:
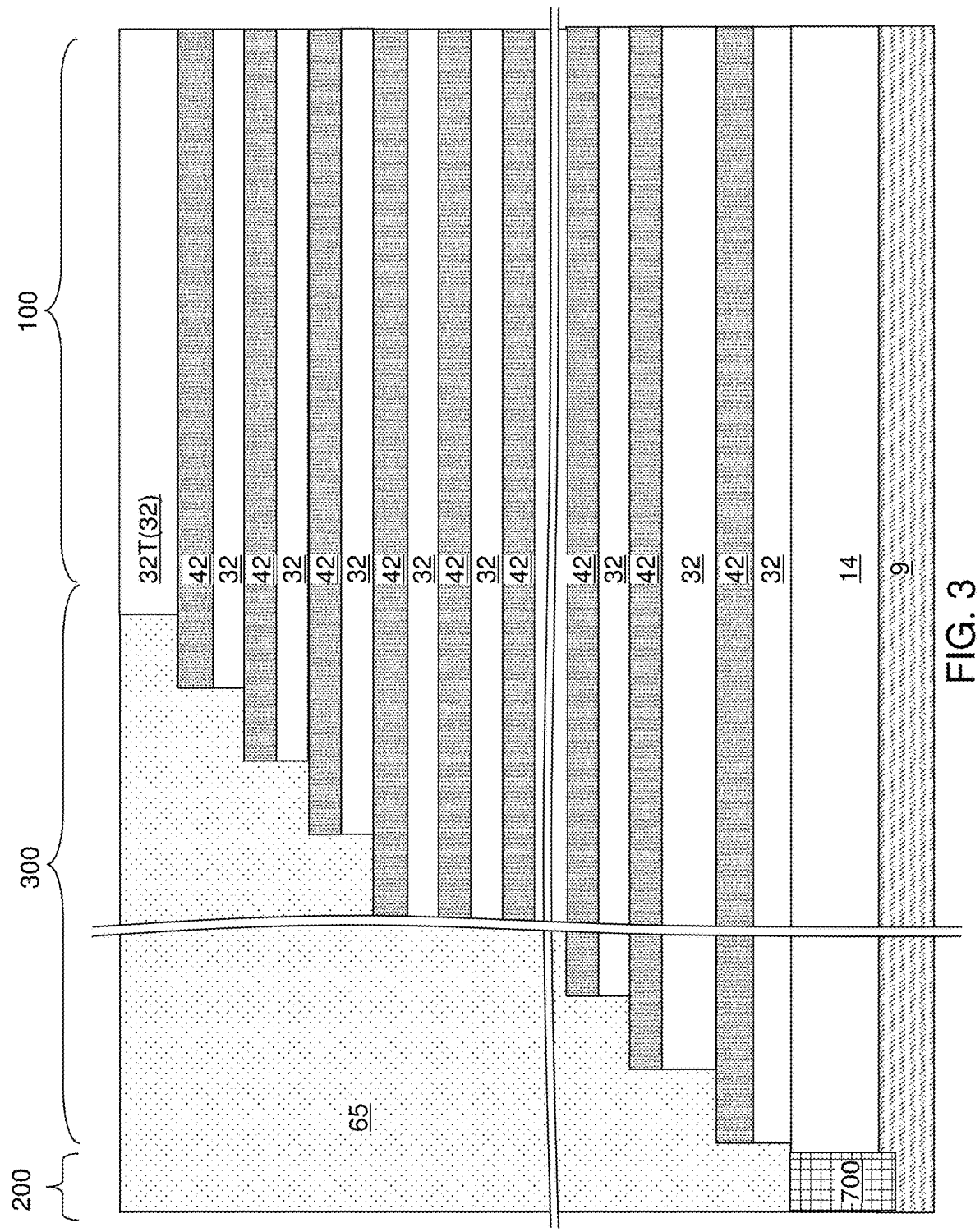
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
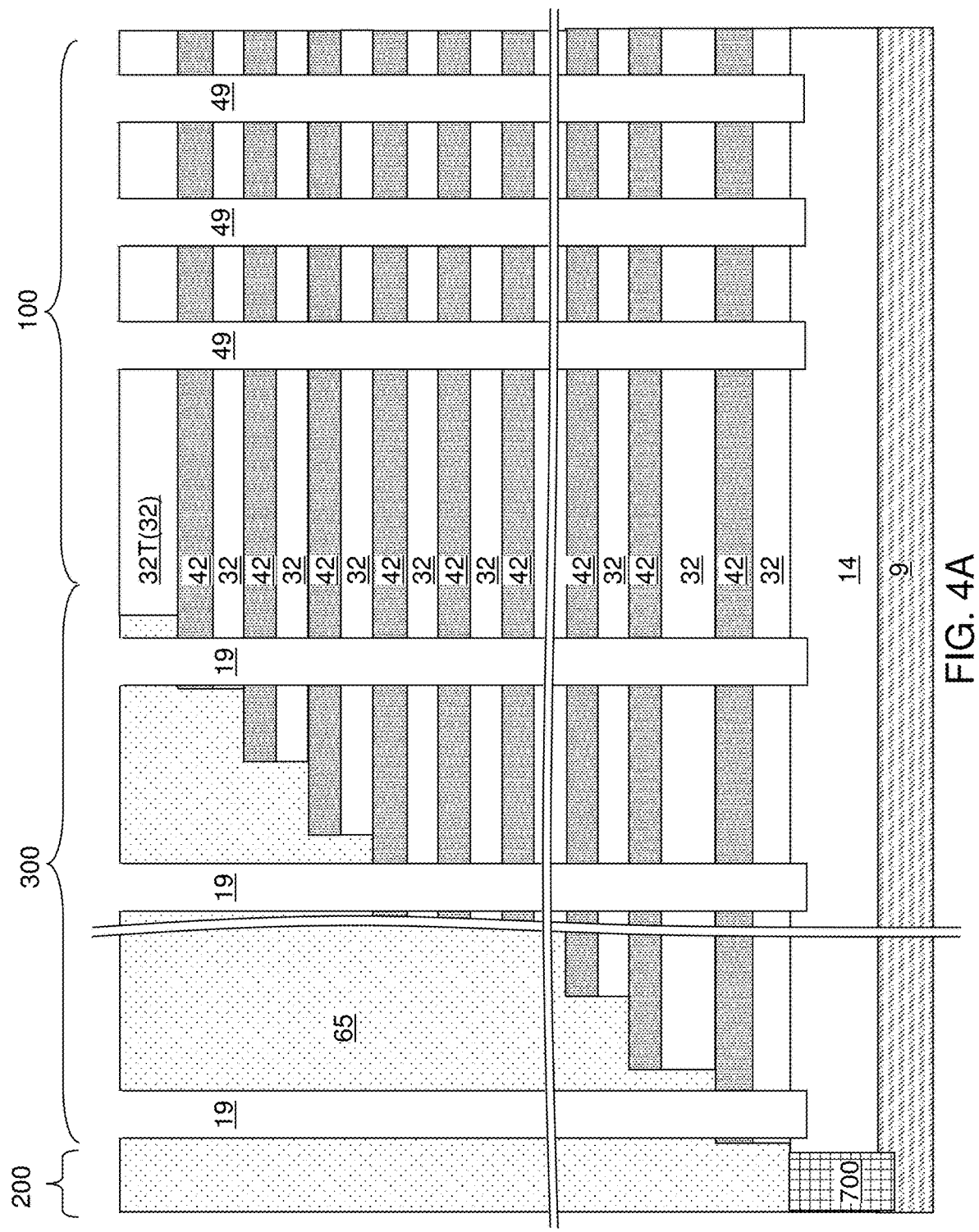
FIG. 4A is a schematic vertical cross-sectional view of the first exemplary structure after formation of memory openings and support openings according to the first embodiment of the present disclosure.
Figure 4B:
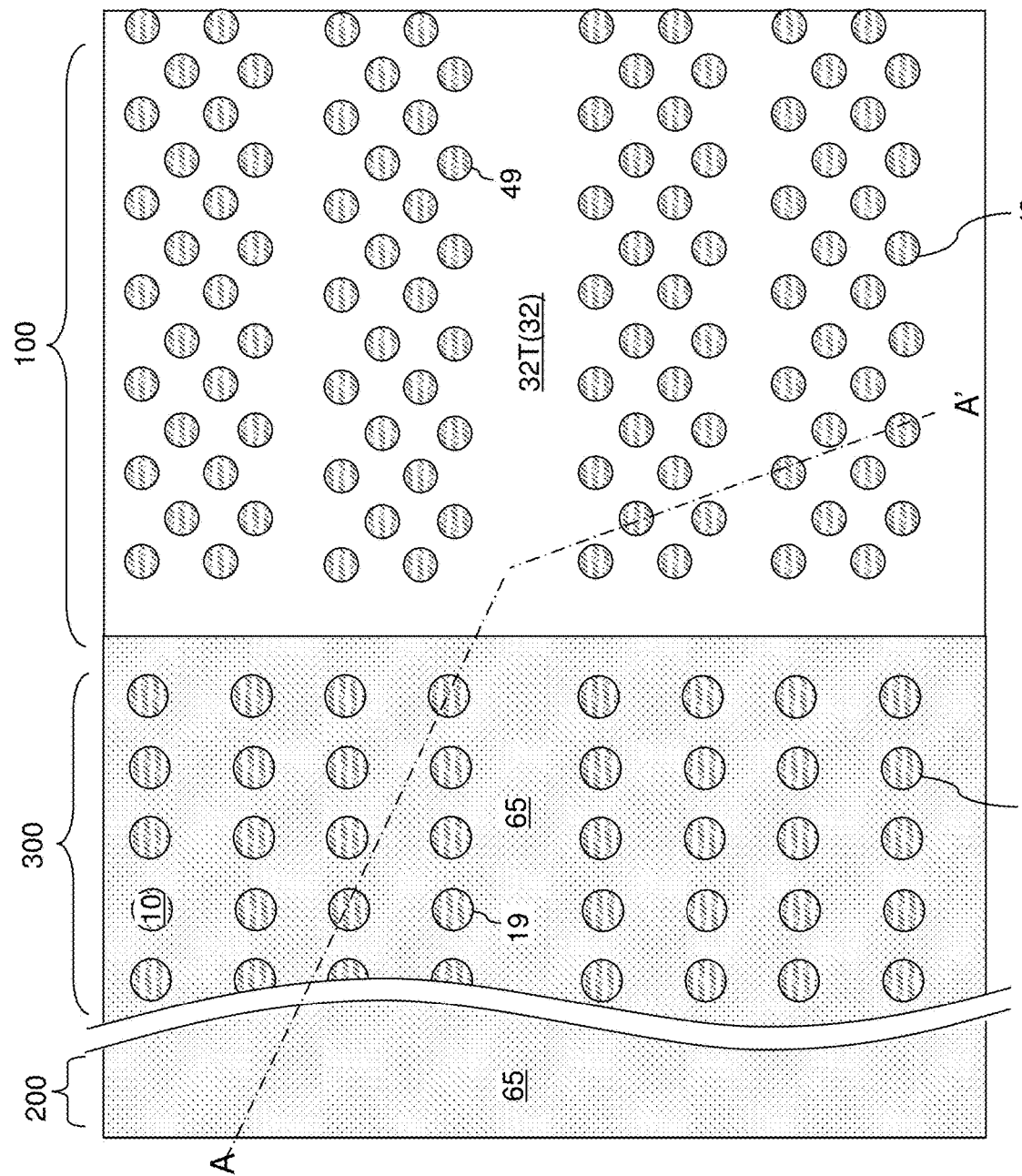
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the planar isolation dielectric layer 14. In one embodiment, an overetch into the planar isolation dielectric layer 14 may be optionally performed after the top surface of the planar isolation dielectric layer 14 is physically exposed at a bottom of each memory opening 49 and each support opening 19. The overetch may be performed prior to, or after, removal of the lithographic material stack. In other words, the recessed surfaces of the planar isolation dielectric layer 14 may be vertically offset from the un-recessed top surfaces of the planar isolation dielectric layer 14 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the planar isolation dielectric layer 14.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. Alternatively, the planar isolation dielectric layer 14 may be omitted.

FIGS. 5A-5G illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the topmost insulating layer 32T, the alternating stack (32, 42), and optionally into an upper portion of the planar isolation dielectric layer 14. At this processing step, each support opening 19 can extend through the retro-stepped dielectric material portion 65, a subset of layers in the alternating stack (32, 42), and optionally through the upper portion of the planar isolation dielectric layer 14. The recess depth of the bottom surface of each memory opening 49 with respect to the top surface of the planar isolation dielectric layer 14 can be in a range from 0 nm to 30 nm, although greater recess depths can also be employed.

Referring to FIG. 5B, an isotropic etch process can be performed to laterally recess physically exposed tubular sidewalls of the sacrificial material layers 42 selective to the material of the insulating layer 32. For example, if the sacrificial material layers 42 include silicon nitride, and if the insulating layers 32 include a doped silicate glass or organosilicate glass, a wet etch process employing hot phosphoric acid can be employed to laterally recess the physically exposed sidewalls of the sacrificial material layers 42 selective to the insulating layers 32. Annular lateral recesses 42R can be formed at levels of the sacrificial material layers 42 around each memory opening 49. The lateral recess distance of the sidewalls of the sacrificial material layers 42 can be in a range from 12 nm to 60 nm, although lesser and greater distances can also be employed.

Referring to FIG. 5C, a selective metal deposition process can be performed to grow a first metallic material from the physically exposed surfaces of the sacrificial material layers 42 in the annular lateral recesses 42R without growing the first metallic material from the physically exposed surfaces of the insulating layers 32. Tubular metallic spacers, which are herein referred to as outer tubular metallic spacers 51, can be formed in the annular lateral recesses 42R by growing the first metallic material from physically exposed surfaces of the sacrificial material layers 42 while suppressing growth of the first metallic material from surfaces of the insulating layers 32. In an illustrative example, the sacrificial material layers 42 can include silicon nitride, the insulating layers 32 can include silicon oxide, and the first metallic material can comprise, and/or consist essentially of ruthenium. In this case, outer tubular metallic spacers 51 comprising, and/or consisting essentially of ruthenium can be grown only from the silicon nitride surfaces of the sacrificial material layers by an atomic layer deposition (ALD) process without growing ruthenium material portions from the silicon oxide surfaces of the insulating layers 32. The lateral thickness of the outer tubular metallic spacers 51 can be in a range from 3 nm to 20 nm, such as from 5 nm to 10 nm, although lesser and greater thicknesses can also be employed.

Alternatively, the first metallic material can be deposited non-selectively and conformally into the memory openings 49 to fill the entire volumes of the annular lateral recesses 42R, and an anisotropic etch process can be performed to remove the first metallic material outside the volumes of the annular lateral recesses 42R. The first metallic material can be subsequently laterally recessed by a selective etch by lateral recess distance that is less than the lateral width of the annular lateral recesses 42R. Each remaining tubular portion of the first metallic material can comprise the outer tubular metallic spacers 51.

Referring to FIG. 5D, ovonic threshold switch material can be selectively deposited on the physically exposed surfaces of the outer tubular metallic spacers 51 to form ovonic threshold switch material portions 52 (i.e., selector material portions) on a respective one of the outer tubular metallic spacers 51. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous).

In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material layer can include, and/or can consist essentially of, a material selected from a GeSeAs alloy, a GeTeAs, a GeSeTeSe alloy, a GeSe alloy, a SeAs alloy, a GeTe alloy, and a SiTe alloy.

In one embodiment, the ovonic thresholds switch material can be deposited by a selective deposition process that induce growth of the ovonic threshold switch material on physically exposed metallic surfaces of the outer tubular metallic spacers 51, and suppresses growth of the ovonic threshold switch material from dielectric surfaces of the insulating layer 32. For example, the ovonic thresholds switch material can include a metal chalcogenide material that grows from the physically exposed surfaces of the outer tubular metallic spacers 51, and does not grow from the physically exposed surfaces of the insulating layers 32.

In one embodiment, the resistivity of the ovonic thresholds switch material decreases at least by two orders of magnitude (i.e., by more than a factor of 100) upon application of an external bias voltage that exceeds a critical bias voltage magnitude (also referred to as threshold voltage). In one embodiment, the composition and the thickness of the ovonic thresholds switch material can be selected such that the critical bias voltage magnitude can be in a range from 1 V to 6 V, although lesser and greater voltages can also be employed for the critical bias voltage magnitude.

Each of the ovonic threshold switch material portions 52 can have a tubular configuration. Thus, each ovonic threshold switch material portion 52 can have an inner cylindrical sidewall, an outer cylindrical sidewall, an annular top surface adjoined to top edges of the inner cylindrical sidewall and the outer cylindrical sidewall, and an annular bottom surface adjoined to bottom edges of the inner cylindrical sidewall and the outer cylindrical sidewall. The inner cylindrical sidewall of each ovonic threshold switch material portion 52 can be laterally recessed with respect to a cylindrical vertical plane including sidewalls of the insulating layers 32 around the memory opening 49. The lateral thickness of the ovonic threshold switch material portions 52 (as measured between the inner cylindrical sidewall and the outer cylindrical sidewall), can be, for example, in a range from 2 nm to 30 nm, such as from 4 nm to 15 nm, although lesser and greater thicknesses can also be employed.

Figure 5F:
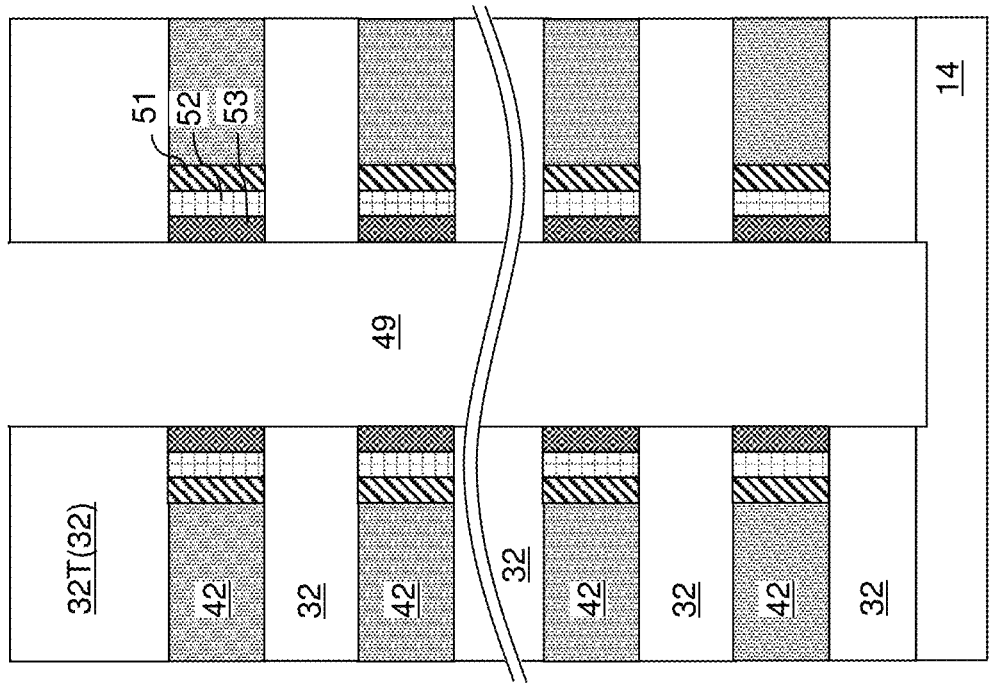
Figure 5E:
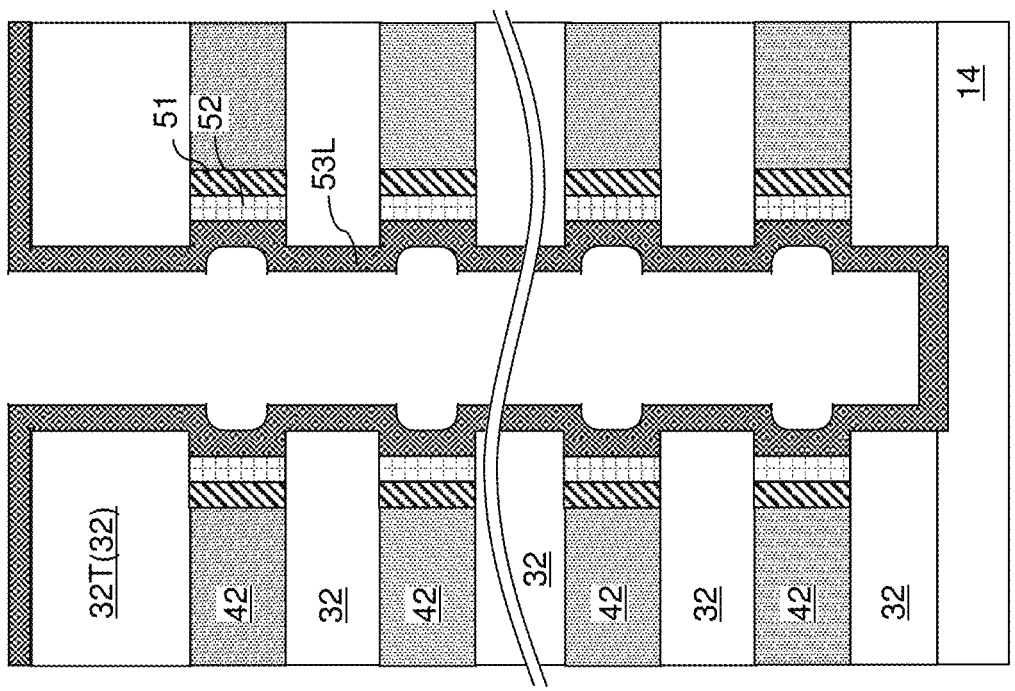

Referring to FIG. 5E, a metallic material layer 53L can be deposited non-selectively in remaining portions of the annular lateral recesses 42R at the levels of the sacrificial material layers 42, over the sidewalls of the insulating layers 32, and over the top surface of the topmost insulating layer 32T by a conformal deposition process. The metallic material layer 53L includes any suitable electrically conductive material which functions as a spacer between the ovonic threshold switch material portions 52 and the ferroelectric tunneling dielectric layer to be subsequently formed. For example, the metallic material layer 53L can include a metallic nitride material such as TiN, TaN, or WN, or a metallic carbide material such as TiC, TaC, or WC. The metallic material layer 53L may be deposited by a chemical vapor deposition process or an atomic layer deposition process, and may have a thickness in a range from 3 nm to 30 nm, such as from 6 nm to 20 nm, although lesser and greater thicknesses can also be employed.

Referring to FIG. 5F, an anisotropic etch process can be performed to remove portions of the metallic material layer 53L that are located outside the annular lateral recesses 42R around each memory opening 49. The anisotropic etch process can include a reactive ion etch process. Each remaining annular portion of the metallic material layer 53L within a respective one of the annular lateral recesses 42R comprises a tubular metallic spacer, which is herein referred to as an inner tubular metallic spacer 53. The inner tubular metallic spacers 53 are formed in unfilled volumes of the lateral recesses after formation of the ovonic threshold switch material portions 52. The annular inner sidewalls of the inner tubular metallic spacers 53 can be vertically coincident with sidewalls of the insulating layers 32 around each memory opening 49.

Figure 5G:
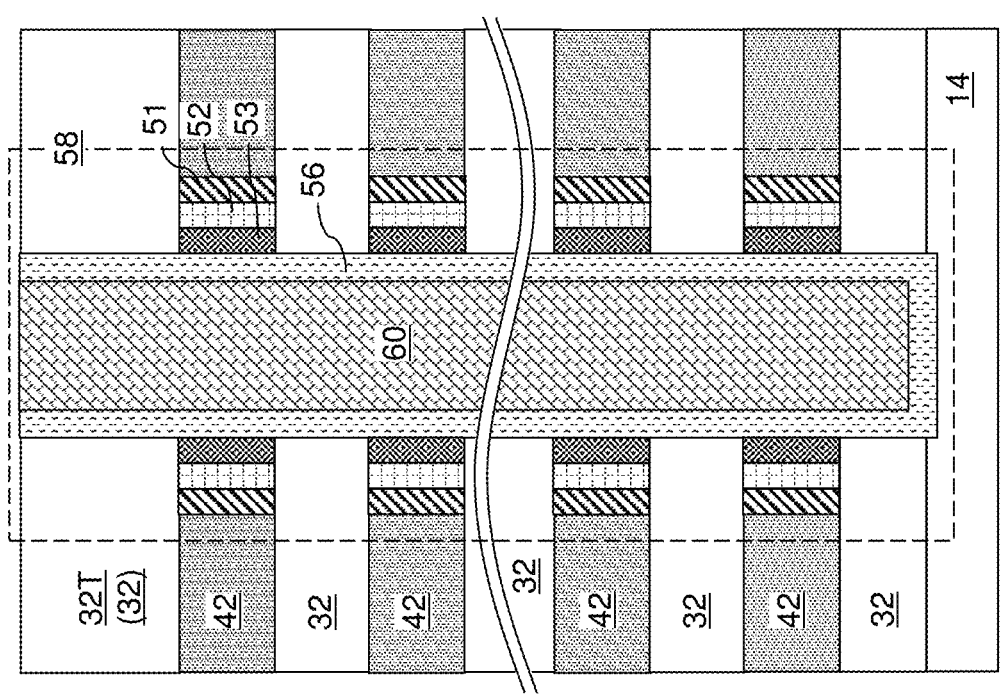

Referring to FIG. 5G, a ferroelectric dielectric material can be conformally deposited on the physically exposed surfaces of inner tubular metallic spacers 53, the sidewalls of the insulating layers 32, and over the top surface of the topmost insulating layer 32T to form a ferroelectric dielectric layer. The ferroelectric dielectric material includes, and/or consists essentially of, at least one ferroelectric material such as hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), colemanite (such as $Ca_2B_6O_{11} \cdot 5H_2O$), bismuth titanate (such as $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as Pb(Zr,Ti) $O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as (Pb,La)(Zr,Ti)$O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric dielectric material can include and/or can consist essentially of the hafnium oxide.

The thickness of the ferroelectric dielectric layer can be selected to allow tunneling of charge carriers (such as electrons) therethrough. As such, the ferroelectric dielectric layer is herein referred to as a continuous ferroelectric tunneling dielectric layer. The thickness of the continuous ferroelectric tunneling dielectric layer can be in a range from 1 nm to 6 nm, such as from 1.5 nm to 4 nm, although lesser and greater thicknesses can also be employed.

A conductive material can be deposited in the remaining volumes of the memory openings 49 by a conformal or nonconformal deposition process. The conductive material can include a heavily doped semiconductor material (such as doped polysilicon) and/or a metallic material (such as a metallic nitride material, such as TiN, an elemental metal, such as tungsten, and/or an intermetallic alloy material, such as tungsten silicide or titanium silicide).

The conductive material that is deposited on the continuous ferroelectric tunneling dielectric layer may be the same as or may be different from the metallic material of the inner tubular metallic spacers 53. In one embodiment, the metallic material of the inner tubular metallic spacers 53 and the conductive material deposited on the continuous ferroelectric tunneling dielectric layer can be selected such that a high level of asymmetry is present in the electrostatic potential energy band profile across a contiguous set of an inner tubular metallic spacer 53, the continuous ferroelectric tunneling dielectric layer, and the conductive material.

Portions of the conductive fill material and the continuous ferroelectric tunneling dielectric layer that overlie the horizontal plane including the top surface of the topmost insulating layer 32T can be removed by a planarization process. The planarization process may include a chemical mechanical planarization process and/or a recess etch process. Each remaining patterned portion of the continuous ferroelectric tunneling dielectric layer is herein referred to as a ferroelectric tunneling dielectric layer 56. Each remaining patterned portions of the conductive fill material comprises a bit line (e.g., vertical bit line (VBL)) 60 that vertically extends through each layer within the alternating stack (32, 42) and into the planar isolation dielectric layer 14.

Each memory opening 49 can be filled with a respective combination of a ferroelectric tunneling dielectric layer 56 and a bit line 60. Each contiguous set of material portions that fills a memory opening 49 and adjacent annular lateral recesses at levels of the sacrificial material layers 42 comprises a memory opening fill structure 58. Each memory opening fill structure 58 can include a bit line 60, a ferroelectric tunneling dielectric layer 56, a vertical stack of inner tubular metallic spacers 53, a vertical stack of ovonic threshold switch material portions 52 (having a respective tubular shape), and a vertical stack of outer tubular metallic spacers 51.

Figure 6:
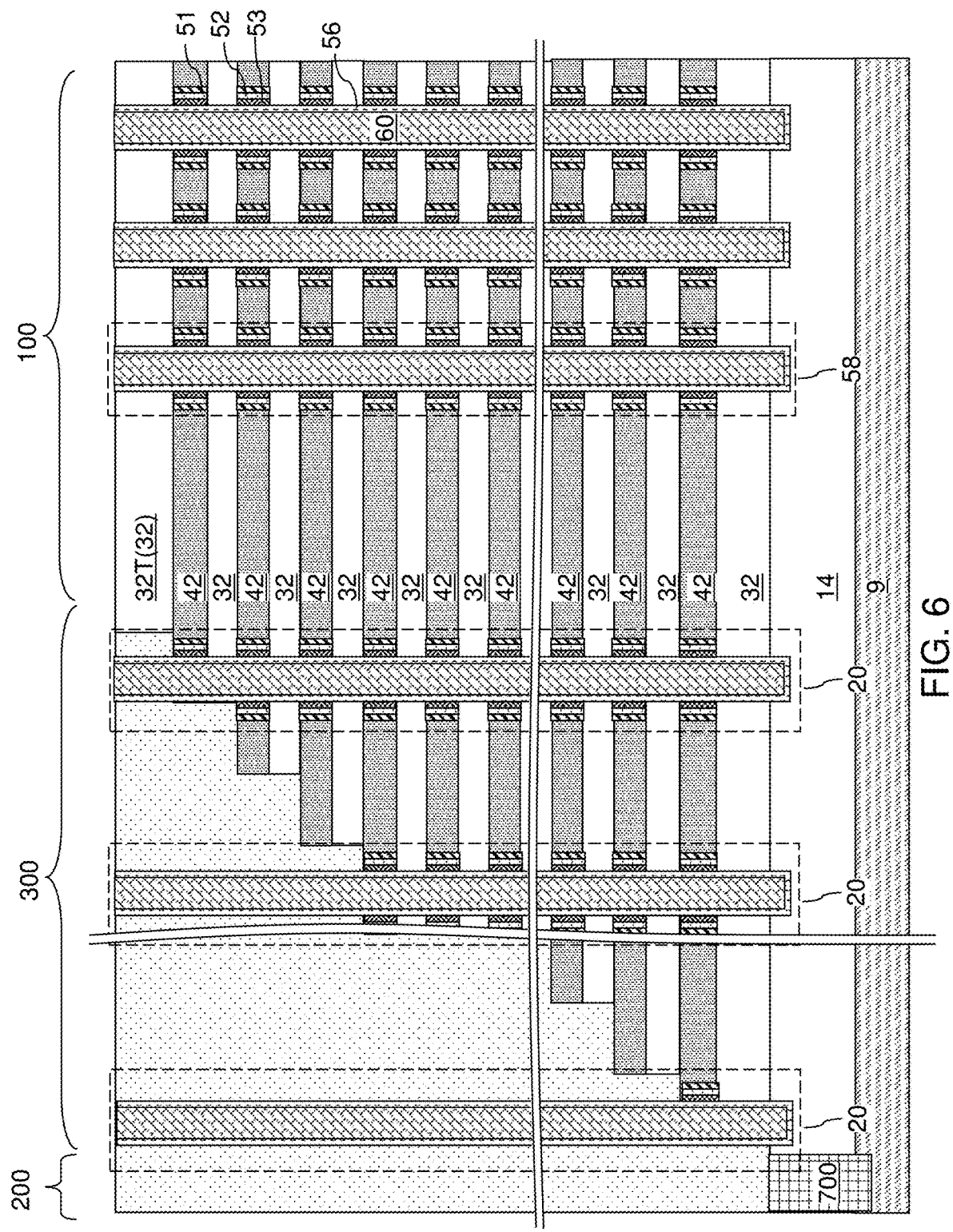
FIG. 6 is a schematic vertical cross-sectional view of the first exemplary structure after formation of memory opening fill structures and support pillar structures according to the first embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7A:
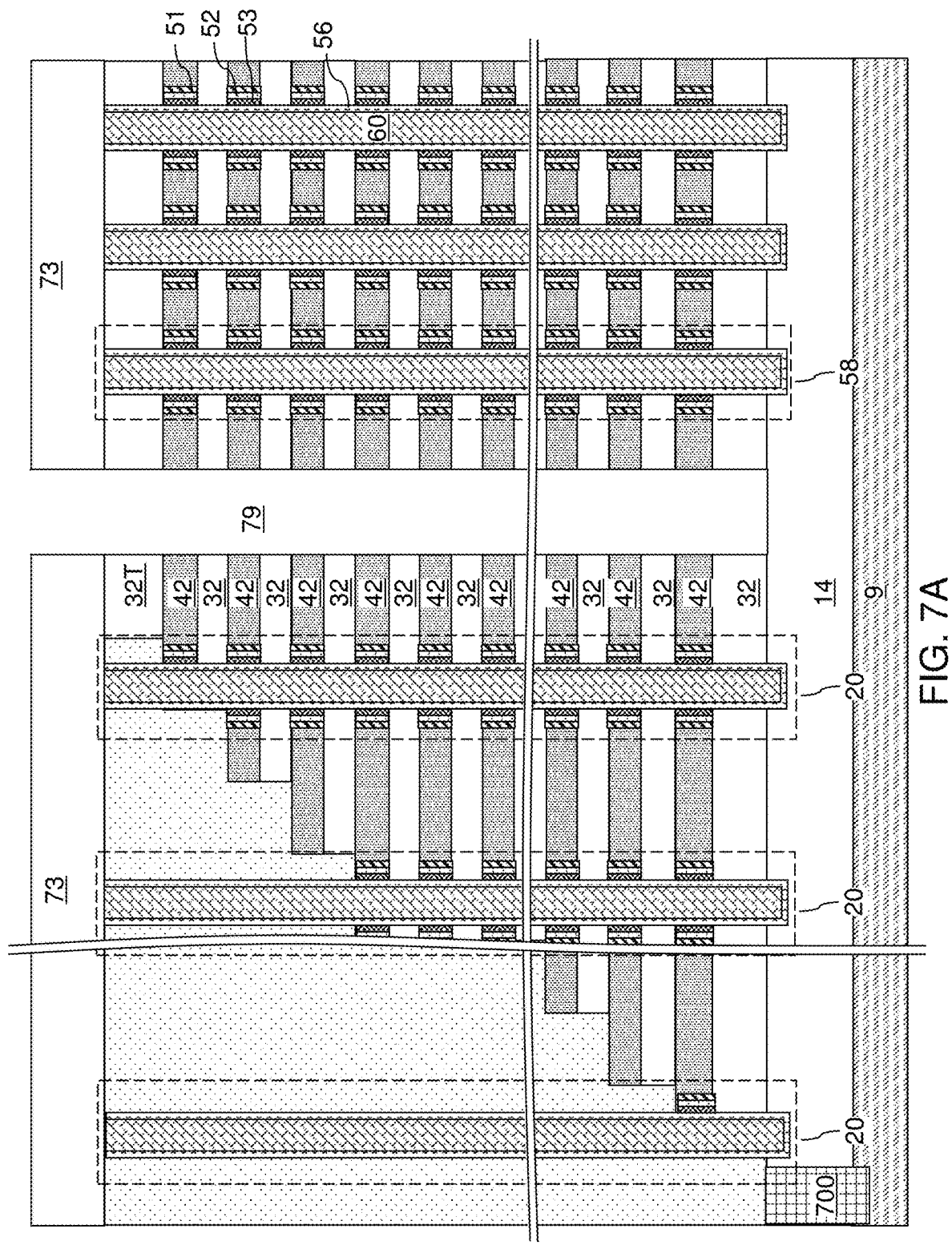
FIG. 7A is a schematic vertical cross-sectional view of the first exemplary structure after formation of a contact-level dielectric layer and backside trenches according to the first embodiment of the present disclosure.
Figure 7B:
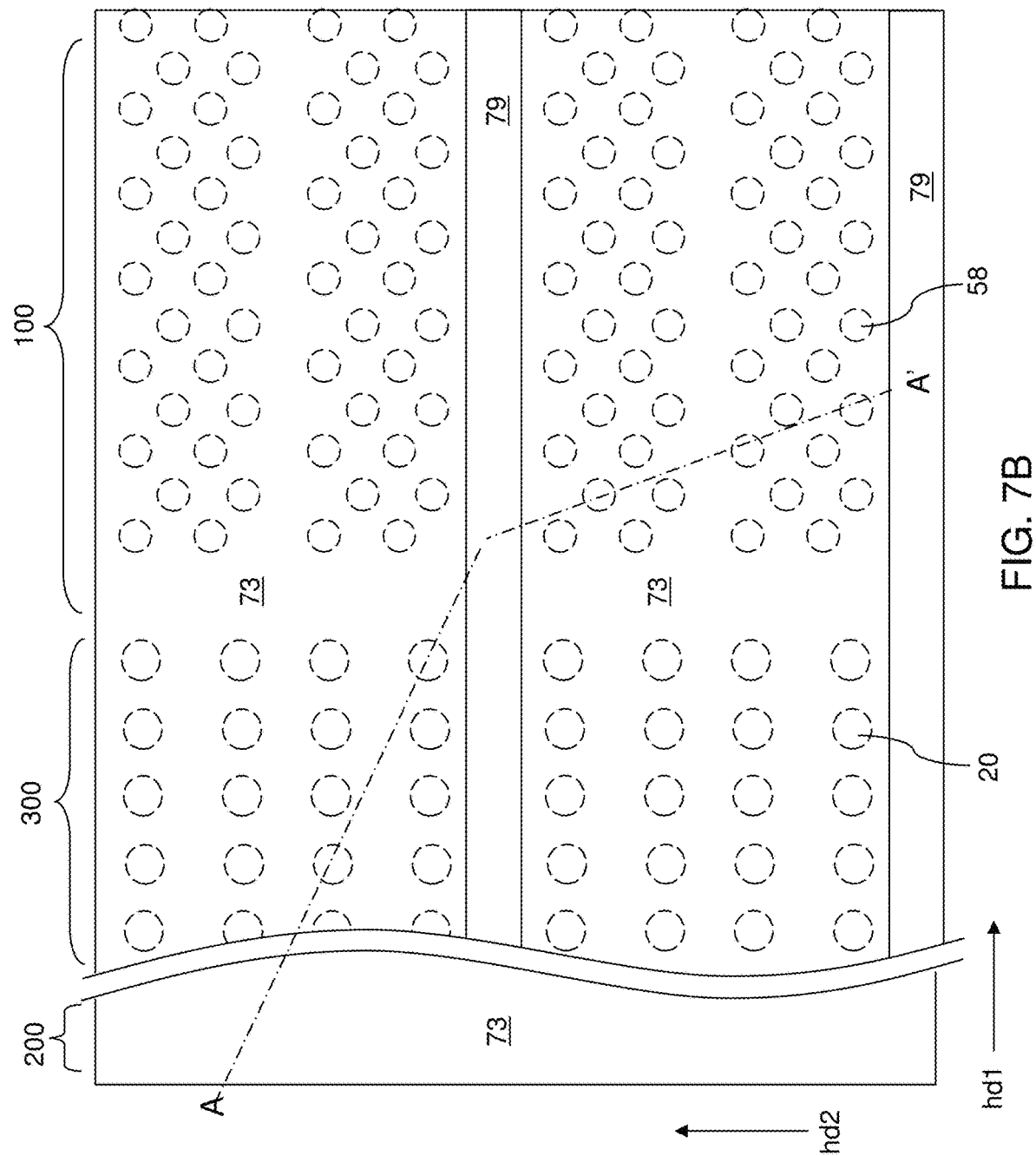
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate, and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 58 can be arranged in rows that extend along the first horizontal direction hd1. Each backside trench 79 can have a uniform width that is invariant along the lengthwise direction (i.e., along the first horizontal direction hd1). Multiple rows of memory opening fill structures 58 can be located between a neighboring pairs of backside trenches 79. The photoresist layer can be removed, for example, by ashing.

Figure 8:
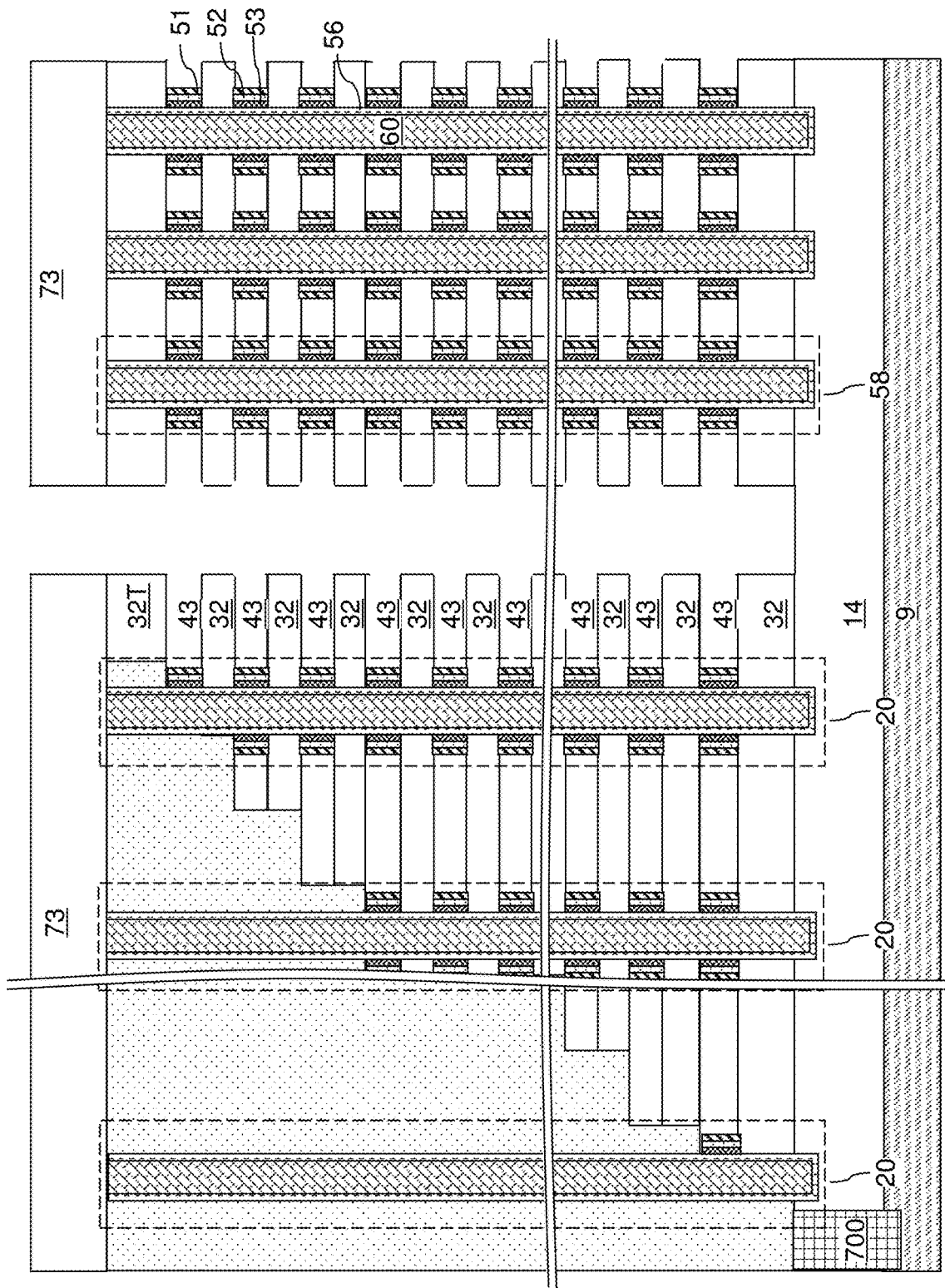
FIG. 8 is a schematic vertical cross-sectional view of the first exemplary structure after formation of backside recesses according to the first embodiment of the present disclosure.
Figure 9A:
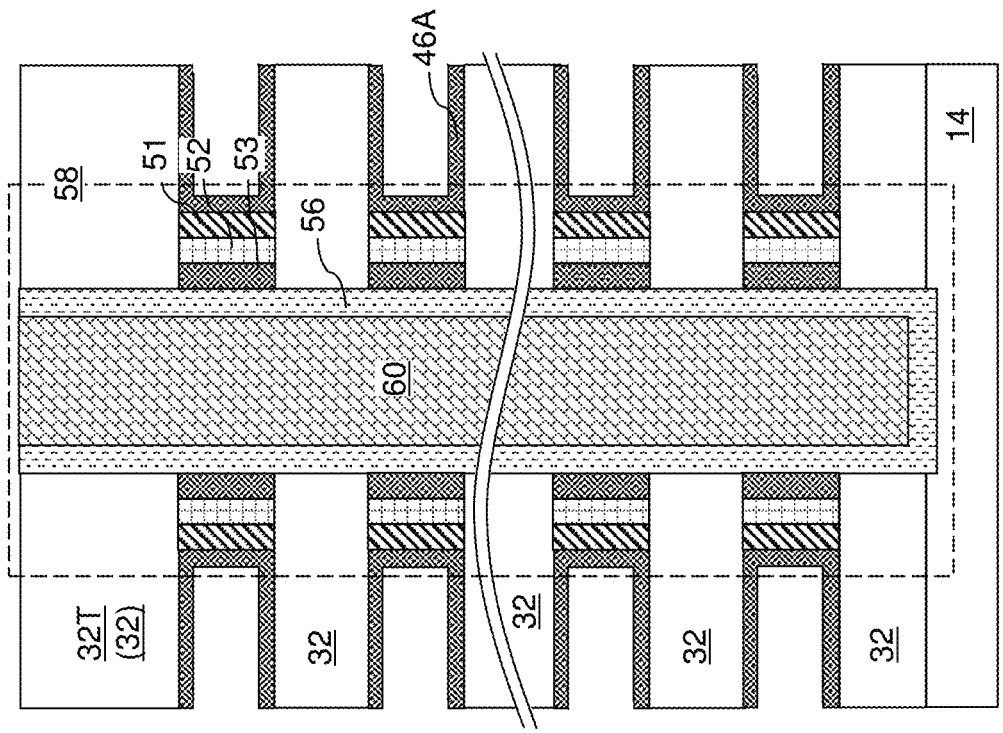
FIGS. 9A-9C are sequential vertical cross-sectional views of a region of the first exemplary structure around a memory opening fill structure during replacement of the sacrificial material layers with electrically conductive layers according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8.

Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the material of the planar isolation dielectric layer 14, and the material of the outer tubular metallic spacers 51. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the sacrificial material layers 42 selective to the insulating layers 32 and the outer tubular metallic spacers 51 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings 49 in which the memory opening fill structures 58 are formed are herein referred to as front side openings in contrast with the backside recesses 43. Each of the plurality of backside recesses 43 can extend substantially parallel to the top surface of the substrate 9. A backside recess 43 can be vertically bounded by a top surface of an underlying insulating layer 32 and a bottom surface of an overlying insulating layer 32. In one embodiment, each backside recess 43 can have a uniform height throughout.

Figure 9B:
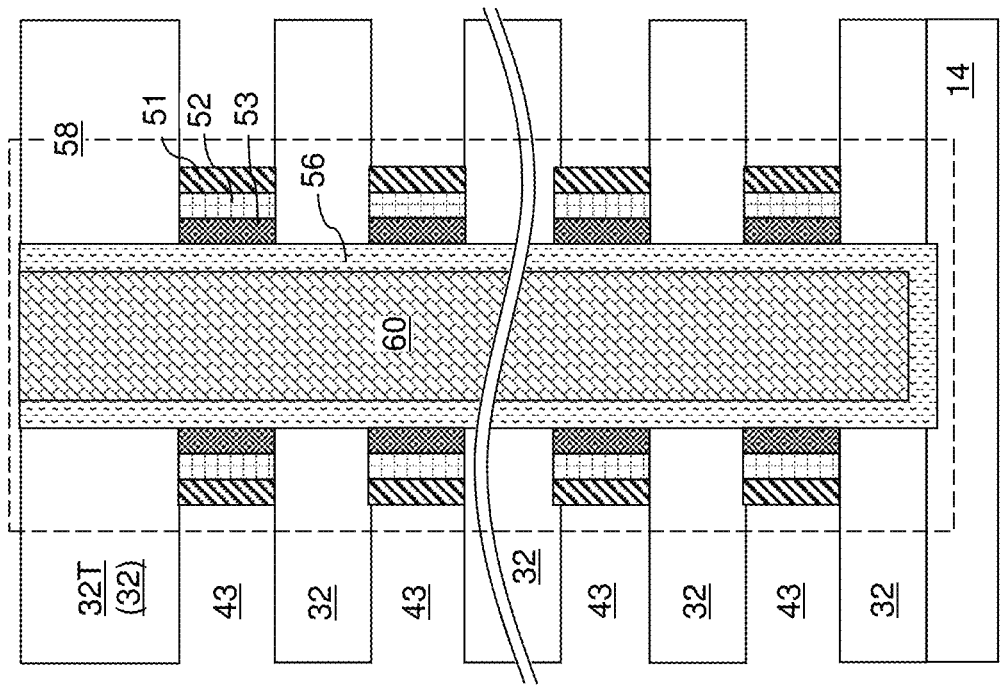

Referring to FIG. 9B, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 9C:
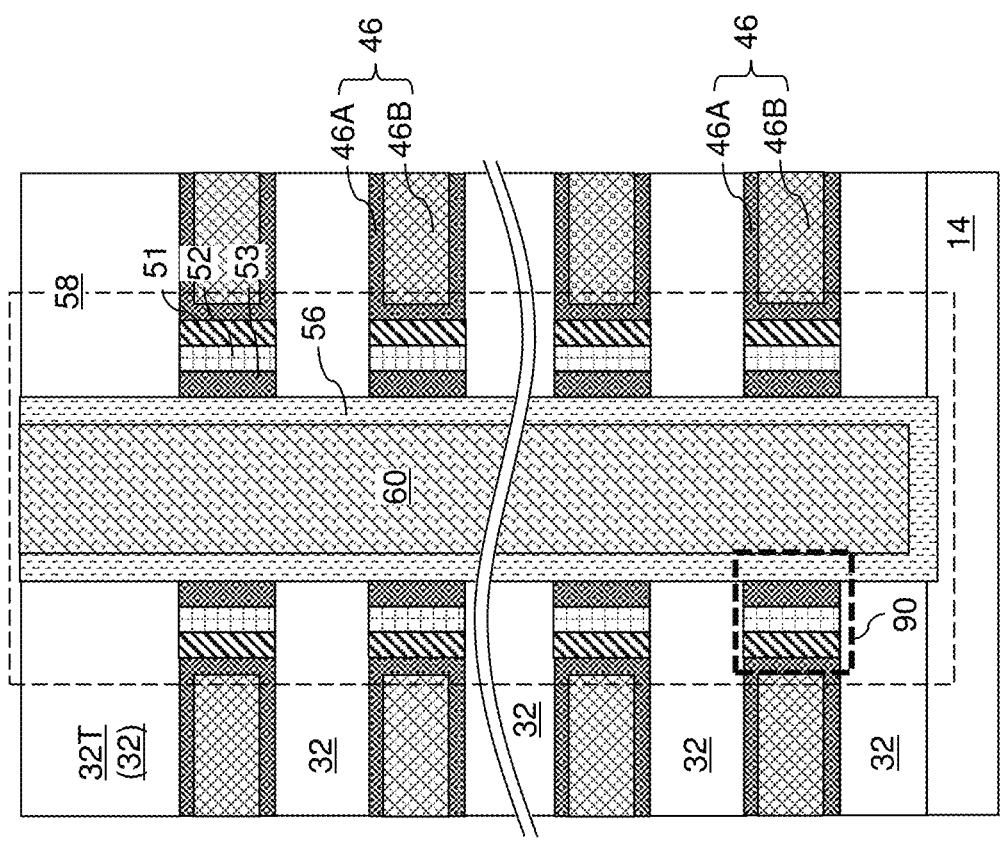
Figure 10:
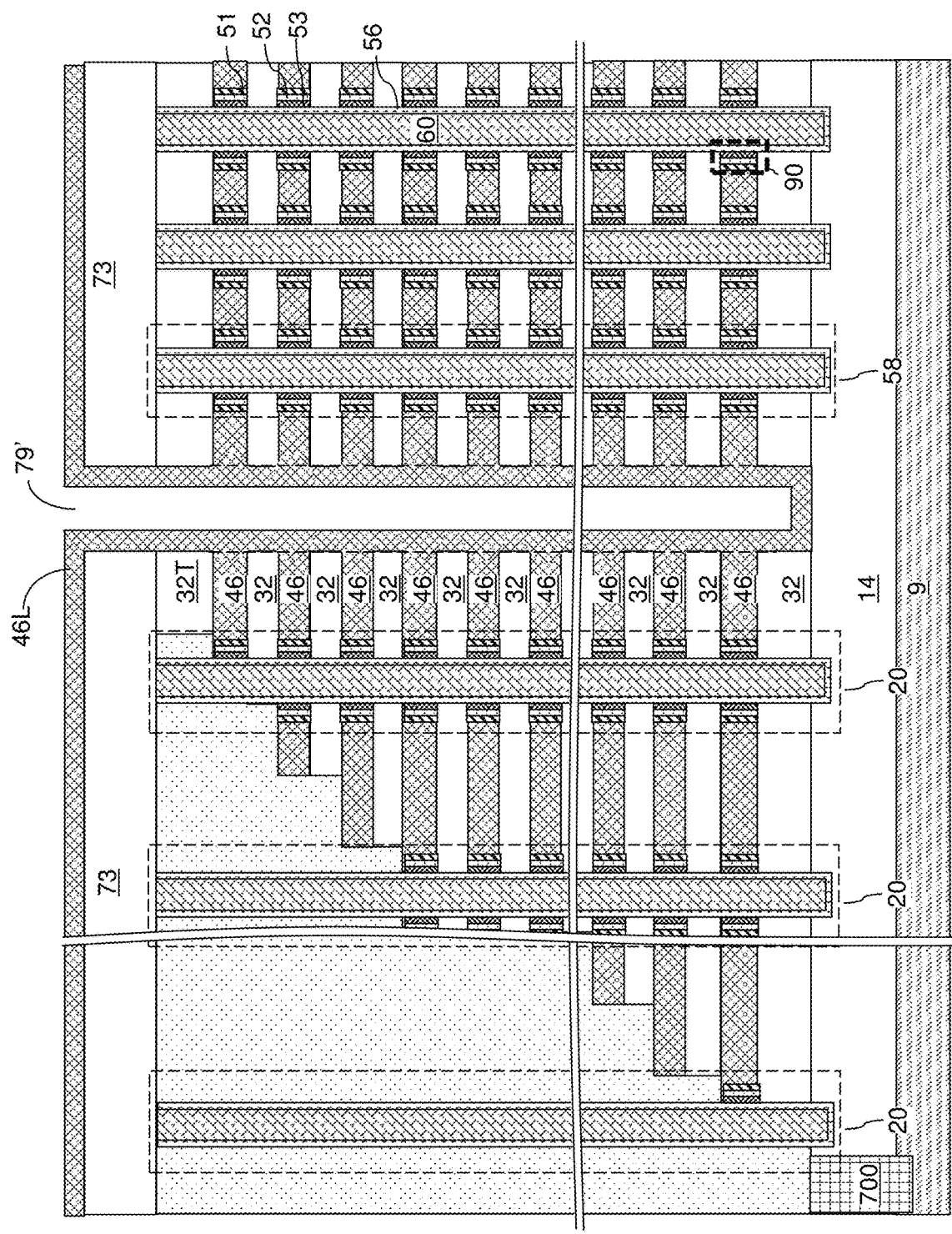
FIG. 10 is a schematic vertical cross-sectional view of the first exemplary structure at the processing steps of FIG. 9C according to the first embodiment of the present disclosure.

Referring to FIGS. 9C and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73. Each sacrificial material layer 42 can be replaced with an electrically conductive layer 46. A backside cavity 79' is present in the portion of each backside trench 79 that is not filled with the continuous electrically conductive material layer 46L.

Each electrically conductive layer 46 can function as a word line for an array of ferroelectric memory elements. Each continuous combination of an outer tubular metallic spacer 51, an ovonic threshold switch material portions 52, an inner tubular metallic spacer 53, and a portion of a ferroelectric tunneling dielectric layer 56 located between an electrically conductive layer (i.e., word line) 46 and a bit line 60 constitutes a ferroelectric tunneling memory cell 90 that displays modulation in tunneling electrical resistance depending on the direction of polarization of the electric dipole moments in the ferroelectric tunneling dielectric layer 56. The direction of polarization of the electric dipole moments in the portion of the ferroelectric tunneling dielectric layer 56 can be programmed by applying a programming voltage across the ferroelectric tunneling memory element. The magnitude of the programming voltage can be selected such that an ovonic threshold switch material portion 52 turns on under an external bias voltage having a magnitude of the programming voltage, and does not turn on under an external bias voltage of less than the magnitude of the programming voltage (e.g., one half of the magnitude of the programming voltage). The programming voltage applied to the bit line relative 60 to the electrically conductive layer (i.e., word line) 46 can have a magnitude that is sufficient to turn on the ovonic threshold switch material portions 52, and can be positive or negative depending on the target direction of polarization of the electric dipole moments in the programmed portion of the ferroelectric tunneling dielectric layer 56.

The sensing of the direction of the electric dipole moments in the portion of the ferroelectric tunneling dielectric layer 56 between a selected bit line 60 and a selected electrically conductive layer (i.e., word line) 46 can be effected by applying a sensing voltage between the selected bit line 60 and the selected electrically conductive layer 46. The magnitude of the sensing voltage can be selected such that an ovonic threshold switch material portion 52 turns on under an external bias voltage having a magnitude of the sensing voltage, and does not turn on under an external bias voltage less than the magnitude of the programming voltage (e.g., one half of the magnitude of the sensing voltage). Further, the magnitude of the sensing voltage is lower than the magnitude of the programming voltage, and is insufficient to program a portion of the ferroelectric tunneling dielectric layer 56. In one embodiment, the magnitude of the sensing voltage can be about 50 mV~200 mV higher than the turn-on voltage for an ovonic threshold switch material portion 52. The selected portion of the ferroelectric tunneling dielectric layer 56 provides modulation of electrical resistance depending on the direction of the direction of the polarization of the electric dipole moments. Thus, a selected portion of a ferroelectric tunneling dielectric layer 56 between a selected bit line 60 and a selected electrically conductive layer (i.e., word line) 46 in the array can be sensed without disturbing unselected portions of the ferroelectric tunneling dielectric layer 56.

Figure 11:
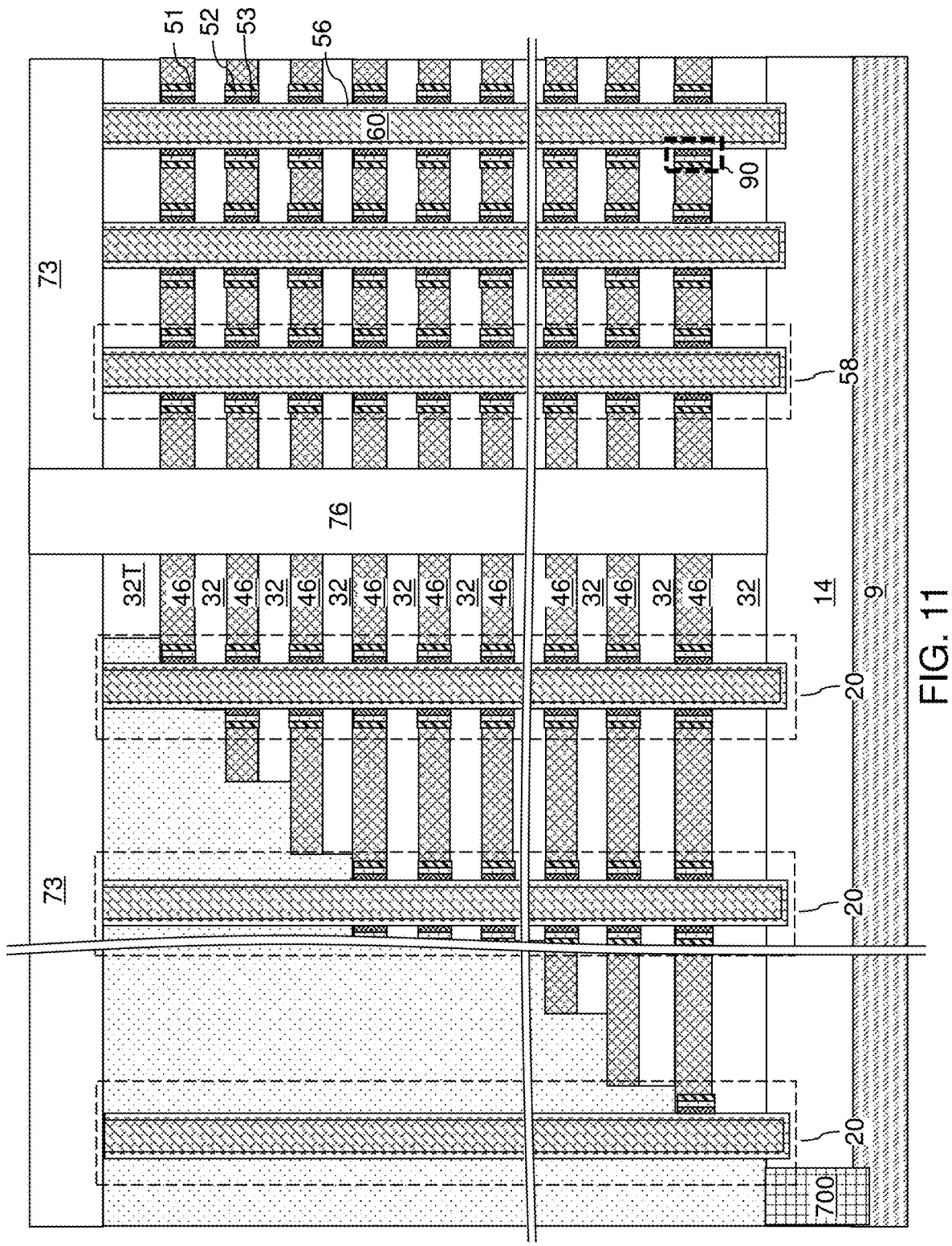
FIG. 11 is a schematic vertical cross-sectional view of the first exemplary structure after formation of dielectric wall structures in the backside trenches according to the first embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive word line. Thus, the sacrificial material layers 42 are replaced with the electrically conductive layers 46.

A dielectric material such as silicon oxide can be deposited in the backside trenches 79 to form dielectric wall structures 76. Optionally, excess portions of the dielectric material can be removed from above the horizontal plane including the top surface of the topmost insulating layer 32T by a planarization process. In this case, each dielectric wall structure 76 can have a planar top surface, which may be within the same horizontal plane as the top surface of the topmost insulating layer 32T.

Figure 12A:
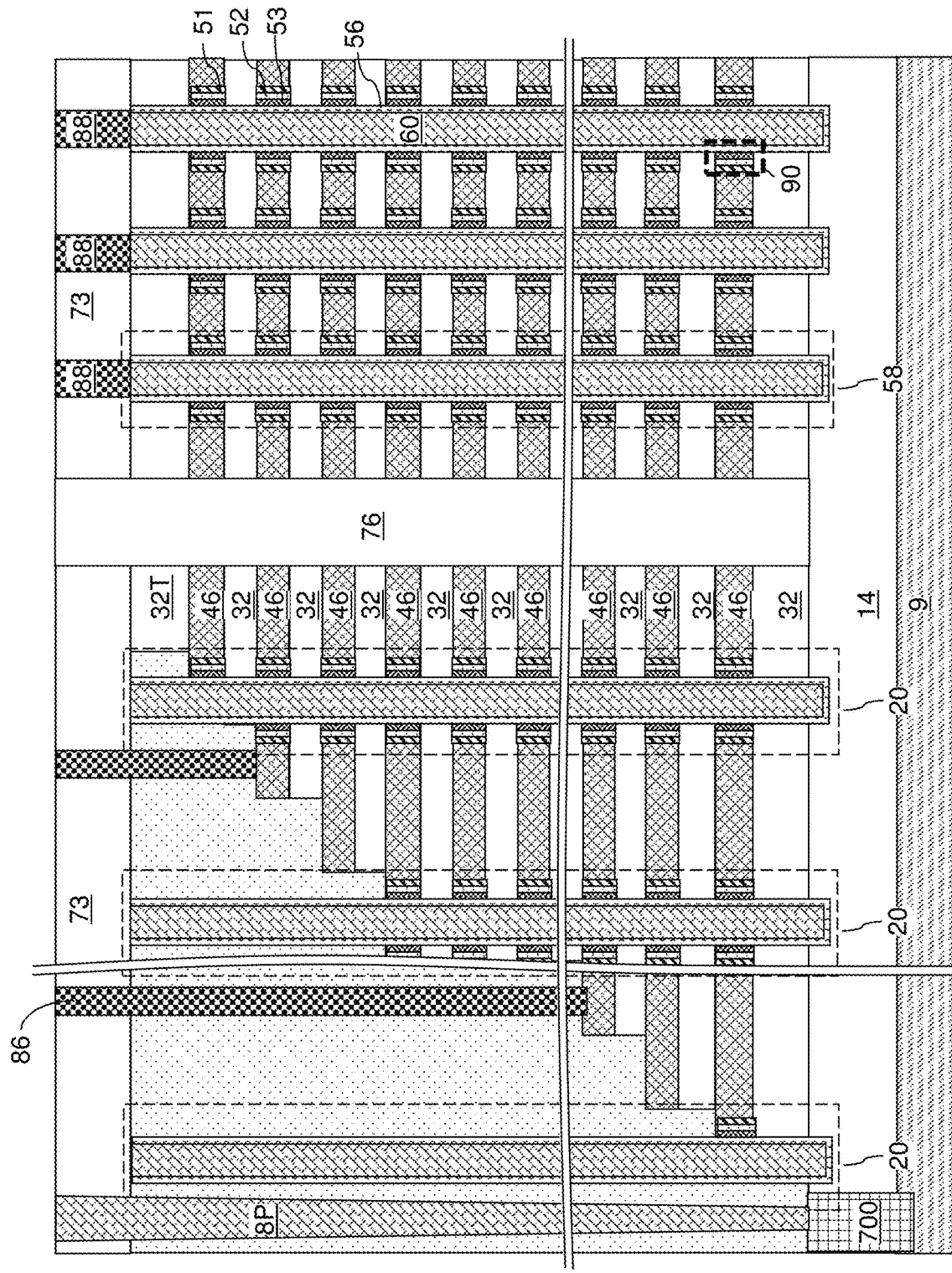
FIG. 12A is a schematic vertical cross-sectional view of the first exemplary structure after formation of contact via structures according to the first embodiment of the present disclosure.
Figure 12B:
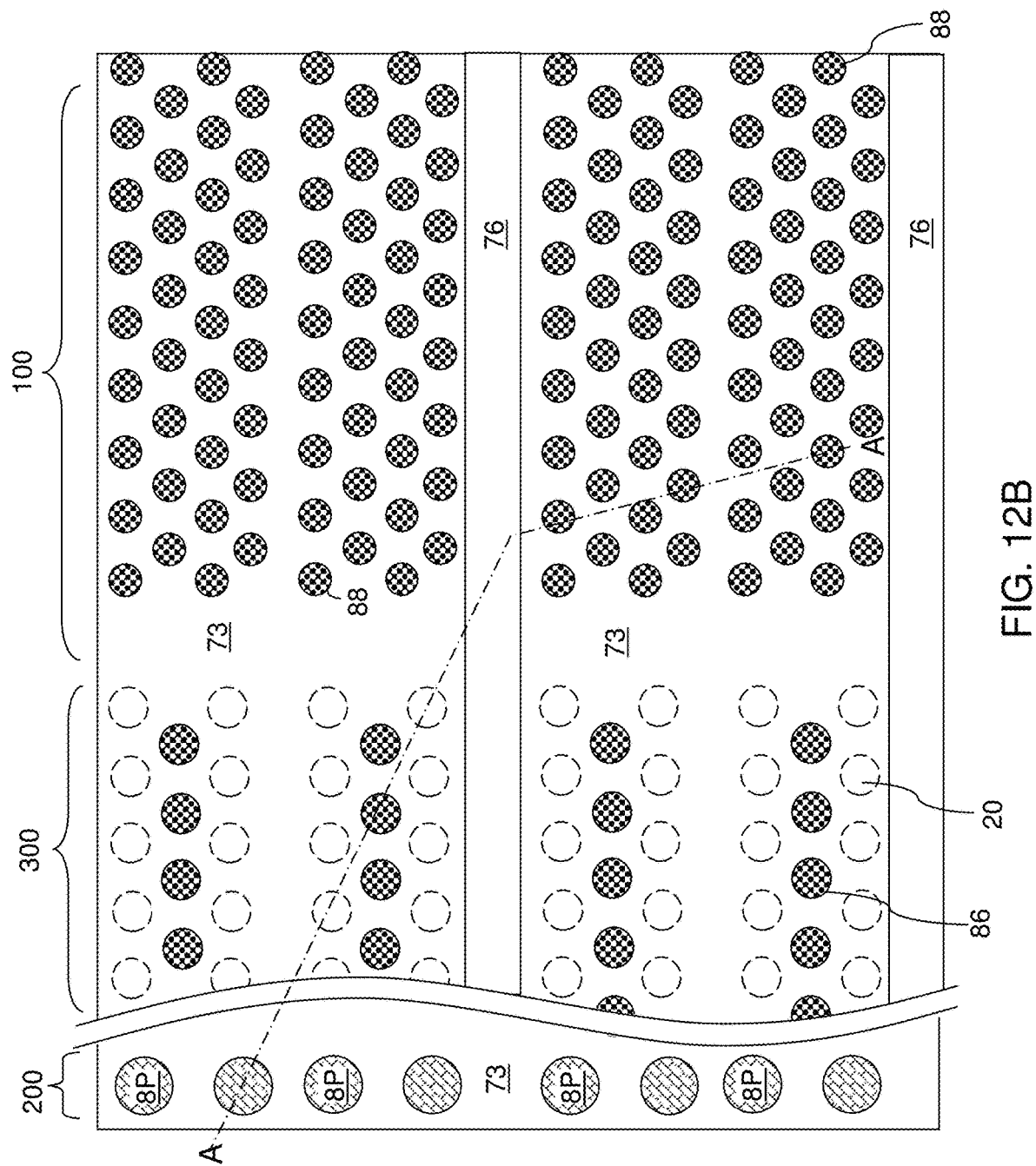
FIG. 12B is a top-down view of the first exemplary structure of FIG. 12A. The vertical plane A-A' is the plane of the schematic vertical cross-sectional view of FIG. 12A.

Referring to FIGS. 12A and 12B, contact via structures (88, 86, 8P) can be formed through the contact level dielectric layer 73, and optionally through the retro-stepped dielectric material portion 65. For example, bit line via structures 88 can be formed through the contact level dielectric layer 73 on each bit line 60. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices 700.

Figure 13A:
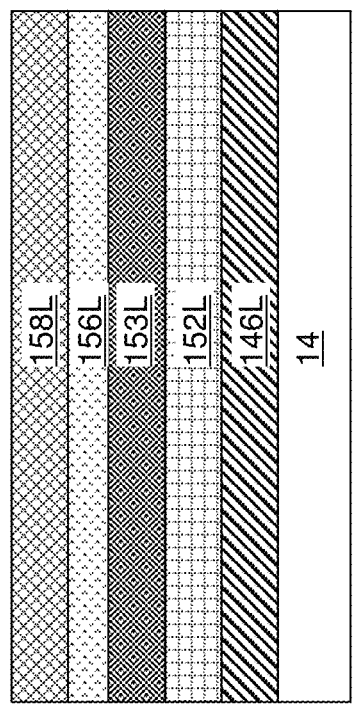
FIG. 13A is a first vertical cross-sectional view of a second exemplary structure after formation of a vertical stack including a first electrically conductive material layer, an ovonic threshold switch material layer, a first metallic spacer material layer, a ferroelectric tunneling dielectric layer, and a second metallic spacer material layer over a substrate according to a second embodiment of the present disclosure.
Figure 13B:
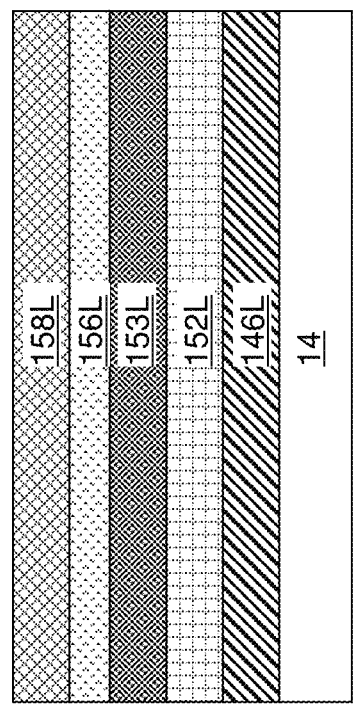
FIG. 13B is a second vertical cross-sectional view of the second exemplary structure of FIG. 13A.
Figure 13C:
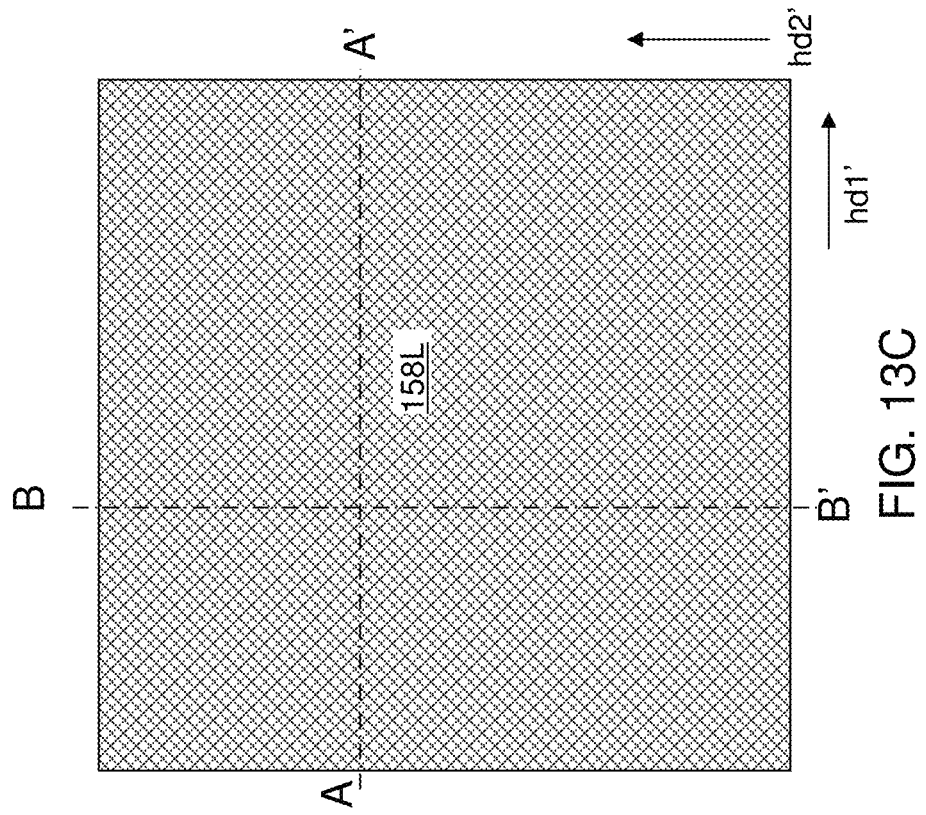
FIG. 13C is a top-down view of the second exemplary structure of FIGS. 13A and 13B. The vertical plane A-A' is the plane of the vertical cross-sectional view of FIG. 13A. The vertical plane B-B' is the plane of the vertical cross-sectional view of FIG. 13B.

Referring to FIGS. 13A-13C, a second exemplary structure according to a second embodiment of the present disclosure is illustrated. The second exemplary structure includes a planar isolation dielectric layer 14, which can be formed on a substrate 9 as illustrated in the first exemplary structure.

A vertical stack (146L, 152L, 153L, 156L, 158L) of blanket (unpatterned) material layers can be formed over the planar isolation dielectric layer 14. The vertical stack (146L, 152L, 153L, 156L, 158L) can include, from bottom to top, a first electrically conductive material layer 146L, an ovonic threshold switch material layer 152L, a first metallic material layer 153L, a continuous ferroelectric tunneling dielectric layer 156L, and a second metallic material layer 158L. Each layer in the vertical stack (146L, 152L, 153L, 156L, 158L) can be formed as a blanket material layer, i.e., an unpatterned material layer that laterally extend along a horizontal direction hd1' and a second horizontal direction hd2' that is perpendicular to the horizontal direction hd1'.

The first electrically conductive material layer 146L includes at least one conductive material, which can be at least one metallic material. For example, the first electrically conductive material layer 146L can include a metallic material such as an elemental metal (e.g., W, Cu, Mo, Co, Ru, etc.), an intermetallic alloy, and/or a conductive metallic compound (e.g., TiN, TaN, WN, TiC, TaC, WC, etc.). The thickness of the first electrically conductive material layer 146L can be in a range from 20 nm to 100 nm, such as from 30 nm to 70 nm, although lesser and greater thicknesses can also be employed.

The ovonic threshold switch material layer 152L can include any material that may be employed for the ovonic threshold switch material portions 52 described above. The thickness of the ovonic threshold switch material layer 152L can be in a range from 2 nm to 30 nm, such as from 4 nm to 15 nm, although lesser and greater thicknesses can also be employed.

The first metallic material layer 153L includes any electrically conductive material (e.g., TiN) that may be employed for the inner tubular metallic spacers 53 described above. The thickness of the first metallic material layer 153L can be in a range from 3 nm to 30 nm, such as from 6 nm to 20 nm, although lesser and greater thicknesses can also be employed.

The continuous ferroelectric tunneling dielectric layer 156L can include any material that can be employed for the ferroelectric tunneling dielectric layer 56 described above. The thickness of the continuous ferroelectric tunneling dielectric layer 156L can be in a range from 1 nm to 6 nm, such as 1 m 1.5 nm to 4 nm, although lesser and greater thicknesses can also be employed. In an alternative embodiment, the positions of the ferroelectric tunneling dielectric layer 156L and the ovonic threshold switch material layer 152L may be reversed, such as that the ovonic threshold switch material layer 152L is located above the first metallic material layer 153L and the ferroelectric tunneling dielectric layer 156L is located below the first metallic material layer 153L.

The second metallic material layer 158L can include any material that can be employed for the bit lines 60 described above, such as tungsten. The thickness of the second metallic material layer 158L can be in a range from 2 nm to 50 nm, such as from 5 nm to 30 nm, although lesser and greater thicknesses can also be employed.

Referring to FIGS. 14A-14C, a photoresist layer (not shown) can be applied over the top surface of the second metallic material layer 158L, and can be lithographically patterned to form a line and space pattern. For example, the line and space pattern can laterally extend along the first horizontal direction hd1', and can be repeated with a periodicity along the second horizontal direction hd2'. The pattern in the photoresist layer can be transferred through the vertical stack (146L, 152L, 153L, 156L, 158L) to form the first line trenches 119. The photoresist layer can be subsequently removed, for example, by ashing.

The first line trenches 119 can laterally extend along the first horizontal direction hd1' and can be laterally spaced apart along the second horizontal direction hd2'. The first line trenches 119 can have a uniform width that is invariant with translation along the first horizontal direction hd1'. The pattern of the first line trenches 119 can be a periodic pattern that is repeated along the second horizontal direction hd2' with a pitch that is equal to the sum of the width of a first line trench 119 and the spacing between a neighboring pair of first line trenches 119. The pitch can be in a range from 32 nm to 600 nm, although lesser and greater pitches can also be employed.

Each patterned portion of the first electrically conductive material layer 146L comprises a first electrically conductive line (e.g., word line) 146. Each patterned portion of the ovonic threshold switch material layer 152L comprises an ovonic threshold switch material rail 152R. Each patterned portion of the first metallic material layer 153L comprises a first metallic material rail 153R. Each patterned portion of the continuous ferroelectric tunneling dielectric layer 156L comprises a ferroelectric tunneling dielectric rail 156R. Each patterned portion of the second metallic material layer 158L comprises a second metallic material rail 158R. Each contiguous stack of a first electrically conductive line 146, an ovonic threshold switch material rail 152R, a first metallic material rail 153R, a ferroelectric tunneling dielectric rail 156R, and a second metallic material rail 158R comprises a rail stack (146, 152R, 153R, 156R, 158R).

Generally, the vertical stack (146L, 152L, 153L, 156L, 158L) can be patterned into rail stacks (146, 152R, 153R, 156R, 158R) that laterally extend along the first horizontal direction hd1'. The patterned portions of the first electrically conductive material layer 146L within the rail stacks (146, 152R, 153R, 156R, 158R) comprise the first electrically conductive lines. 146. A one-dimensional array of first electrically conductive lines 146 can be formed over a substrate. The first electrically conductive lines 146 can laterally extend along the first horizontal direction hd1', and can be laterally spaced apart from each other along the second horizontal direction hd2'.

Referring to FIGS. 15A-15C, a first dielectric material can be deposited in the first line trenches 119. The first dielectric material can include undoped silicate glass, a doped silicate glass, or organosilicate glass. Excess portions of the first dielectric material can be removed from above the horizontal plane including the top surfaces of the second metallic material rails 158R by a planarization process. The planarization process can employ, for example, a chemical mechanical planarization (CMP) process or a recess etch process. Each remaining portion of the first dielectric material that fills a respective first line trench 119 comprises a lower dielectric separator structure 120, which is also referred to as a first dielectric separator structure. The lower dielectric separator structures 120 laterally extend along the first horizontal direction hd1', and are laterally spaced apart from each other along the second horizontal direction hd2'.

Figure 16C:
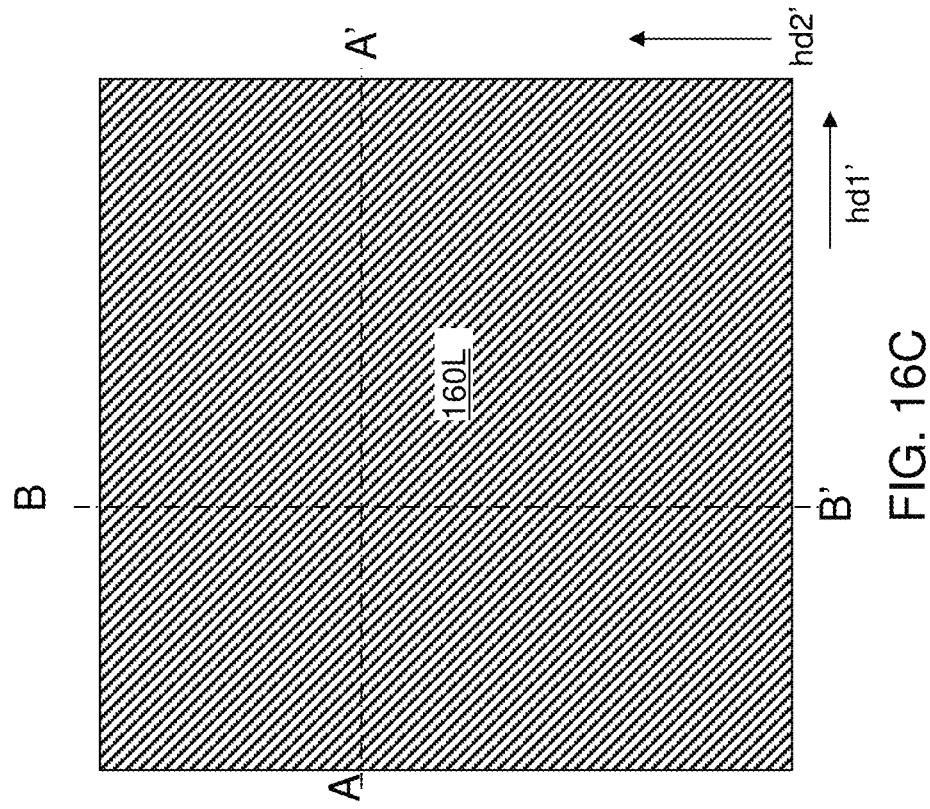
FIG. 16C is a top-down view of the second exemplary structure of FIGS. 16A and 16B. The vertical plane A-A' is the plane of the vertical cross-sectional view of FIG. 16A. The vertical plane B-B' is the plane of the vertical cross-sectional view of FIG. 16B.
Figure 16A:
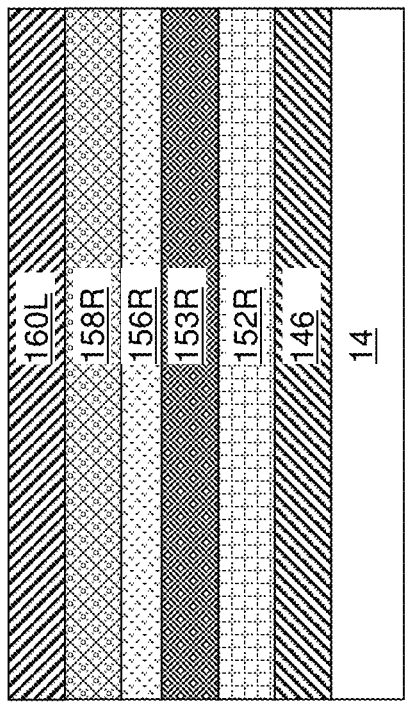
FIG. 16A is a first vertical cross-sectional view of the second exemplary structure after formation of a second electrically conductive layer according to the second embodiment of the present disclosure.
Figure 16B:
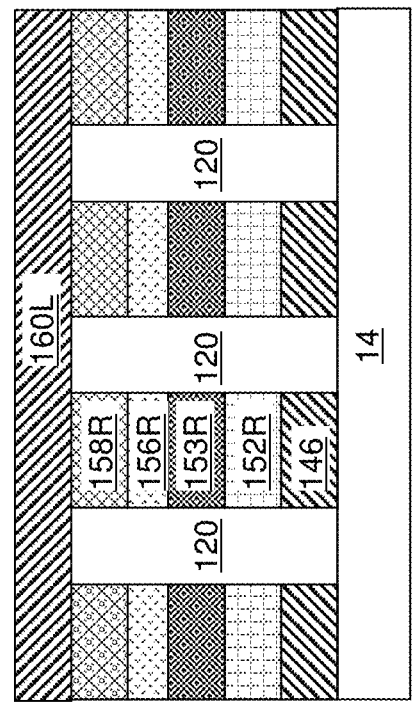
FIG. 16B is a second vertical cross-sectional view of the second exemplary structure of FIG. 16A.
Figure 18D:
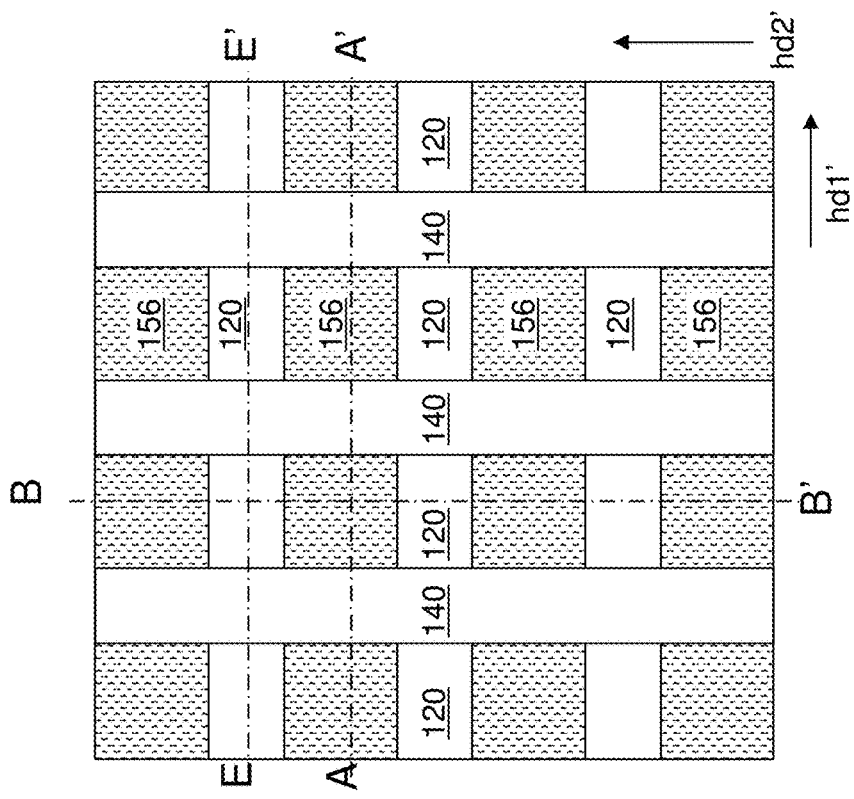
FIG. 18D is a horizontal cross-sectional view of the second exemplary structure along the horizontal plane D-D' of FIGS. 18A and 18B. The vertical plane A-A' is the plane of the vertical cross-sectional view of FIG. 18A. The vertical plane B-B' is the plane of the vertical cross-sectional view of FIG. 18B.
Figure 18E:
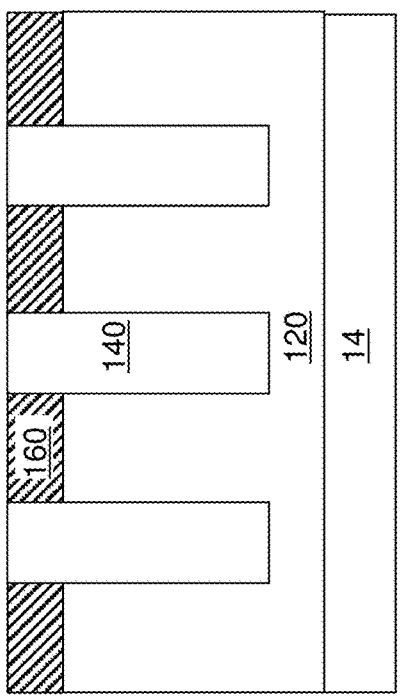
FIG. 18E is a third vertical cross-sectional view along the vertical plane E-E' of the second exemplary structure of FIGS. 18C and 18E.
Figure 18F:
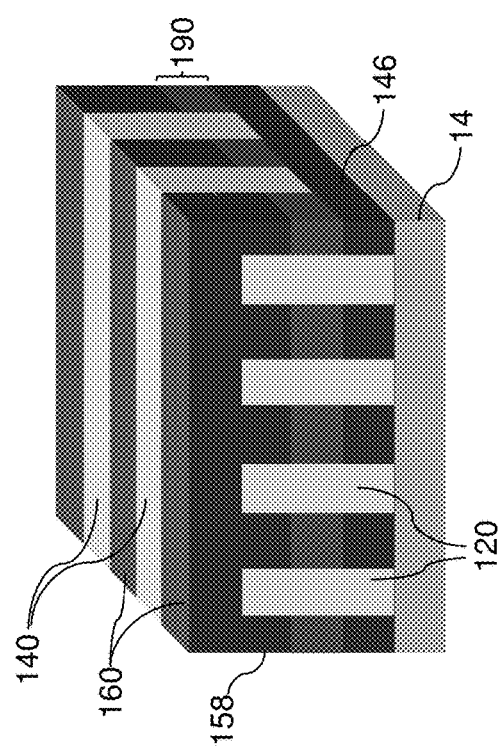
FIG. 18F is a three-dimensional perspective view of the second exemplary structure of FIGS. 18A-18E.

Referring to FIGS. 16A-16C, a second electrically conductive material layer 160L can be formed over the second metallic material rails 158R and the lower dielectric separator structures 120. The second electrically conductive material layer 160L includes at least one conductive material, which can be at least one metallic material. For example, the second electrically conductive material layer 160L can include a metallic material such as an elemental metal (e.g., W, Cu, Mo, Co, Ru, etc.), an intermetallic alloy, and/or a conductive metallic compound (e.g., TiN, TaN, WN, TiC, TaC, WC, etc.). The thickness of the second electrically conductive material layer 160L can be in a range from 20 nm to 100 nm, such as from 30 nm to 70 nm, although lesser and greater thicknesses can also be employed.

Referring to FIGS. 17A-17E, a photoresist layer (not shown) can be applied over the top surface of the second electrically conductive material layer 160L, and can be lithographically patterned to form a line and space pattern. For example, the line and space pattern can laterally extend along the second horizontal direction hd2', and can be repeated with a periodicity along the first horizontal direction hd1'. The pattern in the photoresist layer can be transferred through the second electrically conductive layer 160L, portions of the rail stacks (146, 152R, 153R, 156R, 158R) that exclude the first electrically conductive lines 146, and through the lower dielectric separator structures 120 to form second line trenches 139. The photoresist layer can be subsequently removed, for example, by ashing.

The second line trenches 139 can laterally extend along the second horizontal direction hd2' and can be laterally spaced apart along the first horizontal direction hd1'. The second horizontal direction hd2' can have a uniform width that is invariant with translation along the second horizontal direction hd2'. The pattern of the second line trenches 139 can be a periodic pattern that is repeated along the first horizontal direction hd1' with a pitch that is equal to the sum of the width of a second line trench 139 and the spacing between a neighboring pair of second line trenches 139. The pitch can be in a range from 32 nm to 600 nm, although lesser and greater pitches can also be employed.

Each patterned portion of the second electrically conductive material layer 160L comprises a second electrically conductive line (e.g., bit line) 160. Each patterned portion of an ovonic threshold switch material rail 152R comprises an ovonic threshold switch material plate 152. Each patterned portion of a first metallic material rail 153R comprises a first metallic plate 153. Each patterned portion of a ferroelectric tunneling dielectric rail 156R comprises a ferroelectric tunneling dielectric plate 156. Each patterned portion of a second metallic material rail 158R comprises a second metallic plate 158. Each contiguous stack of an ovonic threshold switch material plate 152, a first metallic plate 153, a ferroelectric tunneling dielectric plate 156, and a second metallic plate 158 comprises a pillar structure (152, 153, 156, 158).

Generally, patterned portions of the rail stacks (146, 152R, 153R, 156R, 158R) that exclude the first electrically conductive lines 146 comprise the array of pillar structures (152, 153, 156, 158). Patterned portions of the second electrically conductive layer 160L comprise second electrically conductive lines 160. An array of pillar structures (146, 152R, 153R, 156R, 158R) can be formed over a one-dimensional array of first electrically conductive lines 146. Each pillar structure (152, 153, 156, 158) can have a rectangular horizontal cross-sectional shape. Each of the pillar structures (152, 153, 156, 158) comprises memory cell 190 which includes the ovonic threshold switch material plate 152 and the ferroelectric tunneling dielectric plate 156 separated by the first metallic plate 153. The plate 152 may be located above or below the plate 153, when the plate 156 is located below or above the plate 153, respectively.

Referring to FIGS. 18A-18F, a second dielectric material can be deposited in the second line trenches 139. The second dielectric material can include undoped silicate glass, a doped silicate glass, or organosilicate glass. Excess portions of the second dielectric material can be removed from above the horizontal plane including the top surfaces of the second electrically conductive lines 160 by a planarization process. The planarization process can employ, for example, a chemical mechanical planarization (CMP) process or a recess etch process. Each remaining portion of the second dielectric material that fills a respective second line trench 139 comprises an upper dielectric separator structure 140, which is also referred to as a second dielectric separator structure. The upper dielectric separator structures 140 laterally extend along the second horizontal direction hd2', and are laterally spaced apart from each other along the first horizontal direction hd1'.

Referring to FIGS. 1-18F and according to all embodiments of the present disclosure, a ferroelectric tunnel junction memory device includes a bit line (60, 160), a word line (46, 146) and a memory cell (90, 190) located between the bit line (60, 160) and the word line (46, 146). The memory cell 90 includes a ferroelectric tunneling dielectric portion (e.g., portion of layer 56 or plate 156) and an ovonic threshold switch material portion (52, 152).

In one embodiment the memory cell (90, 190) comprises a two terminal memory cell of a two terminal memory device. The ferroelectric tunneling dielectric portion comprises hafnium oxide containing at least one dopant selected from Al, Zr, and Si and having a ferroelectric non-centrosymmetric orthorhombic phase, and the ovonic threshold switch material portion comprises a chalcogenide semiconductor material.

In the first embodiment illustrated in FIGS. 2 to 12B, the ferroelectric tunnel junction memory device comprises a three-dimensional ferroelectric tunnel junction memory array comprising a plurality of the word lines 46, a plurality of the bit lines 60 and a plurality of the memory cells 90.

In one embodiment, the ferroelectric tunnel junction memory device further comprises an alternating stack of insulating layers 32 and the plurality of word lines 46 located over a substrate 9, a two-dimensional array of memory openings 49 vertically extending through the alternating stack (32, 46), wherein the plurality of bit lines 60 are located within the respective memory openings 49, ferroelectric tunneling dielectric layers 56 laterally surrounding the respective bit lines 60 located within the respective memory openings 49, wherein each ferroelectric tunneling dielectric portion comprises a portion of one of the ferroelectric tunneling dielectric layers 56 located at a level of one of the plurality of word lines 46, and a three-dimensional array of the ovonic threshold switch material portions 52 located between pairs of the respective word lines 46 and ferroelectric tunneling dielectric layers 56.

In one embodiment, each of the each of the ovonic threshold switch material portions 52 contacts a bottom surface of a respective overlying one of the insulating layers 32 and a top surface of a respective underlying one of the insulating layers 32, and each of the ferroelectric tunneling dielectric layers 56 has a straight outer sidewall that vertically extends through each layer within the alternating stack (32, 46) and contacts each of the insulating layers 32 within the alternating stack.

In one embodiment, the ferroelectric tunnel junction memory device further comprises a three-dimensional array of outer tubular metallic spacers 53 located between each neighboring pair of an ovonic threshold switch material portion 52 of the ovonic threshold switch material portions and a word line of the plurality of word lines 46, and a three-dimensional array of inner tubular metallic spacers 51 located between each neighboring pair of an ovonic threshold switch material portion of the ovonic threshold switch material portions 52 and a ferroelectric tunneling dielectric layer of the ferroelectric tunneling dielectric layers 56.

In one embodiment, each of the ovonic threshold switch material portions 52 has a tubular configuration, laterally surrounds a respective one of the ferroelectric tunneling dielectric layers 56, and has a uniform spacing between a straight outer tubular sidewall and an inner tubular sidewall (which is the lateral thickness of each of the ovonic threshold switch material portions 52). Each of the plurality of bit lines 60 vertically extends through each of the plurality of word lines 46 within the alternating stack (32, 46), and each of the plurality of word lines 46 laterally encircles each of the ferroelectric tunneling dielectric layers 56, and is laterally spaced from each of the ferroelectric tunneling dielectric layers 56 by the respective ovonic threshold switch material portions 52.

Referring to FIGS. 13A-18F and according to the second embodiment of the present disclosure, the ferroelectric tunnel junction memory device comprises a plurality of the word lines 146, a plurality of the bit lines 160 and a plurality of the memory cells 190. The plurality of the word lines 146 laterally extend along a first horizontal direction hd1' and are laterally spaced apart from each other along a second horizontal direction hd2'. The plurality of the memory cells 190 comprise an array of pillar structures located over the plurality of the word lines 146, wherein each of the pillar structures (152, 153, 156) comprises an ovonic threshold switch material plate 152 and a ferroelectric tunneling dielectric plate 156. The plurality of the bit lines 160 laterally extend along the second horizontal direction hd2' and are laterally spaced apart from each other along the first horizontal direction hd1'.

In one embodiment, each of the pillar structures (152, 153, 156) has a rectangular horizontal cross-sectional shape and four straight sidewalls that extend vertically between a respective one of word lines 146 and a respective one of the bit lines 160. Two of the four straight sidewalls can be parallel to the first horizontal direction hd1', and two of the four straight sidewalls can be parallel to the second horizontal direction hd2'.

In one embodiment, the ferroelectric memory device comprises upper dielectric separator structures 140 located between each neighboring pair of columns of the pillar structures (152, 153, 156) that are arranged along the second horizontal direction hd2'.

In one embodiment, the ferroelectric memory device comprises lower dielectric separator structures 120 located between each neighboring pair of rows of the pillar structures (152, 153, 156) that are arranged along the first horizontal direction hd1', wherein each of the lower dielectric separator structures 120 comprises a horizontally-extending portion located between a respective neighboring pair of the word lines 146 and vertically-protruding dielectric pillar portions located between neighboring pairs of the pillar structures (152, 153, 156) that are spaced along the first horizontal direction hd1'.

In one embodiment, each of the pillar structures (152, 153, 156) comprises a first metallic plate 153 located between the ovonic threshold switch material plate 152 and the ferroelectric tunneling dielectric plate 156. In one embodiment, each of the pillar structures (152, 153, 156) further comprises a second metallic plate 158 located between the ferroelectric tunneling dielectric plate 156 and a respective one of the bit lines 160. In one embodiment, each of the ovonic threshold switch material plates 152 is located either above or below the first metallic plate.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric tunnel junction memory device, comprising:
    a bit line;
    a word line; and
    a memory cell located between the bit line and the word line, wherein the memory cell comprises a ferroelectric tunneling dielectric portion and an ovonic threshold switch material portion;
    wherein:
    the memory cell comprises a two terminal memory cell;
    the ferroelectric tunneling dielectric portion comprises hafnium oxide containing at least one dopant selected from Al, Zr, and Si and having a ferroelectric non-centrosymmetric orthorhombic phase; and
    the ovonic threshold switch material portion comprises a chalcogenide semiconductor material.

2. The ferroelectric tunnel junction memory device of claim 1, wherein the ferroelectric tunnel junction memory device comprises a three-dimensional ferroelectric tunnel junction memory array comprising a plurality of the word lines, a plurality of the bit lines and a plurality of the memory cells.

3. The ferroelectric tunnel junction memory device of claim 2, further comprising:
    an alternating stack of insulating layers and the plurality of word lines located over a substrate;
    a two-dimensional array of memory openings vertically extending through the alternating stack, wherein the plurality of bit lines are located within the respective memory openings;
    ferroelectric tunneling dielectric layers laterally surrounding the respective bit lines located within the respective memory openings, wherein the ferroelectric tunneling dielectric portion comprises a portion of one of the ferroelectric tunneling dielectric layers located at a level of one of the plurality of word lines; and
    a three-dimensional array of the ovonic threshold switch material portions located between pairs of the respective word lines and ferroelectric tunneling dielectric layers.

4. The ferroelectric tunnel junction memory device of claim 3, wherein:
    each of the each of the ovonic threshold switch material portions contacts a bottom surface of a respective overlying one of the insulating layers and a top surface of a respective underlying one of the insulating layers; and
    each of the ferroelectric tunneling dielectric layers has a straight outer sidewall that vertically extends through each layer within the alternating stack and contacts each of the insulating layers within the alternating stack.

5. The ferroelectric tunnel junction memory device of claim 4, further comprising:
    a three-dimensional array of outer tubular metallic spacers located between each neighboring pair of an ovonic threshold switch material portion of the ovonic threshold switch material portions and a word line of the plurality of word lines; and
    a three-dimensional array of inner tubular metallic spacers located between each neighboring pair of an ovonic threshold switch material portion of the ovonic threshold switch material portions and a ferroelectric tunneling dielectric layer of the ferroelectric tunneling dielectric layers.

6. The three-dimensional ferroelectric memory device of claim 3, wherein:
each of the ovonic threshold switch material portions has a tubular configuration, laterally surrounds a respective one of the ferroelectric tunneling dielectric layers, and has a uniform spacing between a straight outer tubular sidewall and an inner tubular sidewall;
each of the plurality of bit lines vertically extends through each of the plurality of word lines within the alternating stack; and
each of the plurality of word lines laterally encircles each of the ferroelectric tunneling dielectric layers, and is laterally spaced from each of the ferroelectric tunneling dielectric layers by the respective ovonic threshold switch material portions.

7. The three-dimensional ferroelectric memory device of claim 1, wherein:
the ferroelectric tunnel junction memory device comprises a plurality of the word lines, a plurality of the bit lines and a plurality of the memory cells;
the plurality of the word lines laterally extend along a first horizontal direction and are laterally spaced apart from each other along a second horizontal direction;
the plurality of the memory cells comprise an array of pillar structures located over the plurality of the word lines, wherein each of the pillar structures comprises an ovonic threshold switch material plate and a ferroelectric tunneling dielectric plate; and
the plurality of the bit lines laterally extend along the second horizontal direction and are laterally spaced apart from each other along the first horizontal direction.

8. The ferroelectric memory device of claim 7, wherein each of the pillar structures has a rectangular horizontal cross-sectional shape and four straight sidewalls that extend vertically between a respective one of the word lines and a respective one of the bit lines.

9. The ferroelectric memory device of claim 7, further comprising upper dielectric separator structures located between each neighboring pair of columns of the pillar structures that are arranged along the second horizontal direction.

10. The ferroelectric memory device of claim 9, further comprising lower dielectric separator structures located between each neighboring pair of rows of the pillar structures that are arranged along the first horizontal direction, wherein each of the lower dielectric separator structures comprises a horizontally-extending portion located between a respective neighboring pair of the word lines and vertically-protruding dielectric pillar portions located between neighboring pairs of the pillar structures that are spaced along the first horizontal direction.

11. The ferroelectric memory device of claim 7, wherein each of the pillar structures comprises a first metallic plate located between the ovonic threshold switch material plate and the ferroelectric tunneling dielectric plate.

12. The ferroelectric memory device of claim 11, wherein each of the pillar structures comprises a second metallic plate located between the ferroelectric tunneling dielectric plate and a respective one of the bit lines.

13. The ferroelectric memory device of claim 11, wherein each of the ovonic threshold switch material plates is located either above or below the first metallic plate.

14. A ferroelectric tunnel junction memory device, comprising:
a three-dimensional ferroelectric tunnel junction memory array comprising a plurality of the word lines, a plurality of the bit lines, and a plurality of the memory cells located between the plurality of the word lines and the plurality of the bit lines, wherein each of the memory cell comprises a ferroelectric tunneling dielectric portion and an ovonic threshold switch material portion;
an alternating stack of insulating layers and the plurality of word lines located over a substrate;
a two-dimensional array of memory openings vertically extending through the alternating stack, wherein the plurality of bit lines are located within the respective memory openings;
ferroelectric tunneling dielectric layers laterally surrounding the respective bit lines located within the respective memory openings, wherein the ferroelectric tunneling dielectric portion comprises a portion of one of the ferroelectric tunneling dielectric layers located at a level of one of the plurality of word lines; and
a three-dimensional array of the ovonic threshold switch material portions located between pairs of the respective word lines and ferroelectric tunneling dielectric layers.

15. The ferroelectric tunnel junction memory device of claim 14, wherein:
each of the each of the ovonic threshold switch material portions contacts a bottom surface of a respective overlying one of the insulating layers and a top surface of a respective underlying one of the insulating layers; and
each of the ferroelectric tunneling dielectric layers has a straight outer sidewall that vertically extends through each layer within the alternating stack and contacts each of the insulating layers within the alternating stack.

16. The ferroelectric tunnel junction memory device of claim 15, further comprising:
a three-dimensional array of outer tubular metallic spacers located between each neighboring pair of an ovonic threshold switch material portion of the ovonic threshold switch material portions and a word line of the plurality of word lines; and
a three-dimensional array of inner tubular metallic spacers located between each neighboring pair of an ovonic threshold switch material portion of the ovonic threshold switch material portions and a ferroelectric tunneling dielectric layer of the ferroelectric tunneling dielectric layers.

17. The three-dimensional ferroelectric memory device of claim 14, wherein:
each of the ovonic threshold switch material portions has a tubular configuration, laterally surrounds a respective one of the ferroelectric tunneling dielectric layers, and has a uniform spacing between a straight outer tubular sidewall and an inner tubular sidewall;
each of the plurality of bit lines vertically extends through each of the plurality of word lines within the alternating stack; and
each of the plurality of word lines laterally encircles each of the ferroelectric tunneling dielectric layers, and is laterally spaced from each of the ferroelectric tunneling dielectric layers by the respective ovonic threshold switch material portions.

18. A ferroelectric tunnel junction memory device, comprising:
- a plurality of word lines;
- a plurality of bit lines; and
- a plurality of memory cells located between the plurality of the word lines and the plurality of the bit lines, wherein each of the memory cell comprises a ferroelectric tunneling dielectric portion and an ovonic threshold switch material portion;

wherein:
- the plurality of the word lines laterally extend along a first horizontal direction and are laterally spaced apart from each other along a second horizontal direction;
- the plurality of the memory cells comprise an array of pillar structures located over the plurality of the word lines, wherein each of the pillar structures comprises an ovonic threshold switch material plate and a ferroelectric tunneling dielectric plate;
- the plurality of the bit lines laterally extend along the second horizontal direction and are laterally spaced apart from each other along the first horizontal direction; and
- each of the pillar structures comprises a first metallic plate located between the ovonic threshold switch material plate and the ferroelectric tunneling dielectric plate.

19. The ferroelectric memory device of claim 18, wherein each of the pillar structures comprises a second metallic plate located between the ferroelectric tunneling dielectric plate and a respective one of the bit lines.

20. The ferroelectric memory device of claim 18, wherein each of the ovonic threshold switch material plates is located either above or below the first metallic plate.

\* \* \* \* \*